(12) United States Patent
Morimoto et al.

(10) Patent No.: US 11,495,581 B2
(45) Date of Patent: Nov. 8, 2022

(54) SEMICONDUCTOR MODULE

(71) Applicant: Yazaki Corporation, Tokyo (JP)

(72) Inventors: Mitsuaki Morimoto, Shizuoka (JP);
Kazuo Sugimura, Shizuoka (JP);
Kazuya Tsubaki, Shizuoka (JP);
Eiichiro Oishi, Shizuoka (JP);
Yasuyuki Shigezane, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/409,097

(22) Filed: Aug. 23, 2021

(65) Prior Publication Data
US 2022/0068891 A1 Mar. 3, 2022

(30) Foreign Application Priority Data
Aug. 26, 2020 (JP) .............................. JP2020-142370

(51) Int. Cl.
*H01L 25/07* (2006.01)
*H01L 23/50* (2006.01)

(52) U.S. Cl.
CPC ............ *H01L 25/072* (2013.01); *H01L 23/50* (2013.01)

(58) Field of Classification Search
CPC ....... H01L 25/072; H01L 23/50; H01L 24/48; H01L 24/49; H01L 2224/49111; H01L 2224/49175; H01L 23/04; H01L 23/5386; H01L 25/162; H01L 2224/48227; H01L 23/49838; H01L 23/49844
See application file for complete search history.

(56) References Cited

U.S. PATENT DOCUMENTS

| | | | |
|---|---|---|---|
| 2009/0257211 A1 | 10/2009 | Kontani et al. |
| 2011/0297964 A1 | 12/2011 | Miura |
| 2014/0124915 A1 | 5/2014 | Hayashi et al. |
| 2017/0338162 A1 | 11/2017 | Cottet et al. |

FOREIGN PATENT DOCUMENTS

| | | |
|---|---|---|
| JP | 11-016937 A | 1/1999 |
| JP | 2005-216876 A | 8/2005 |

*Primary Examiner* — Elias Ullah
(74) *Attorney, Agent, or Firm* — Sughrue Mion, PLLC

(57) ABSTRACT

In a semiconductor module, semiconductor chips are each provided with a drain portion on one of a pair of surfaces facing each other, and a source portion and a gate portion on the other surface. Substrates each include three power supply patterns capable of transmitting power supplied from a power supply, and at least two signal patterns capable of transmitting a control signal. The three power supply patterns and the two signal patterns extend in parallel to each other along a first direction. Among the three power supply patterns, two of them are capable of mounting the semiconductor chips and connectable to the drain portions of the mounted semiconductor chips, and remaining one of them is connectable to the source portions of the semiconductor chips. The two signal patterns are connectable to the gate portions of the semiconductor chips.

19 Claims, 9 Drawing Sheets

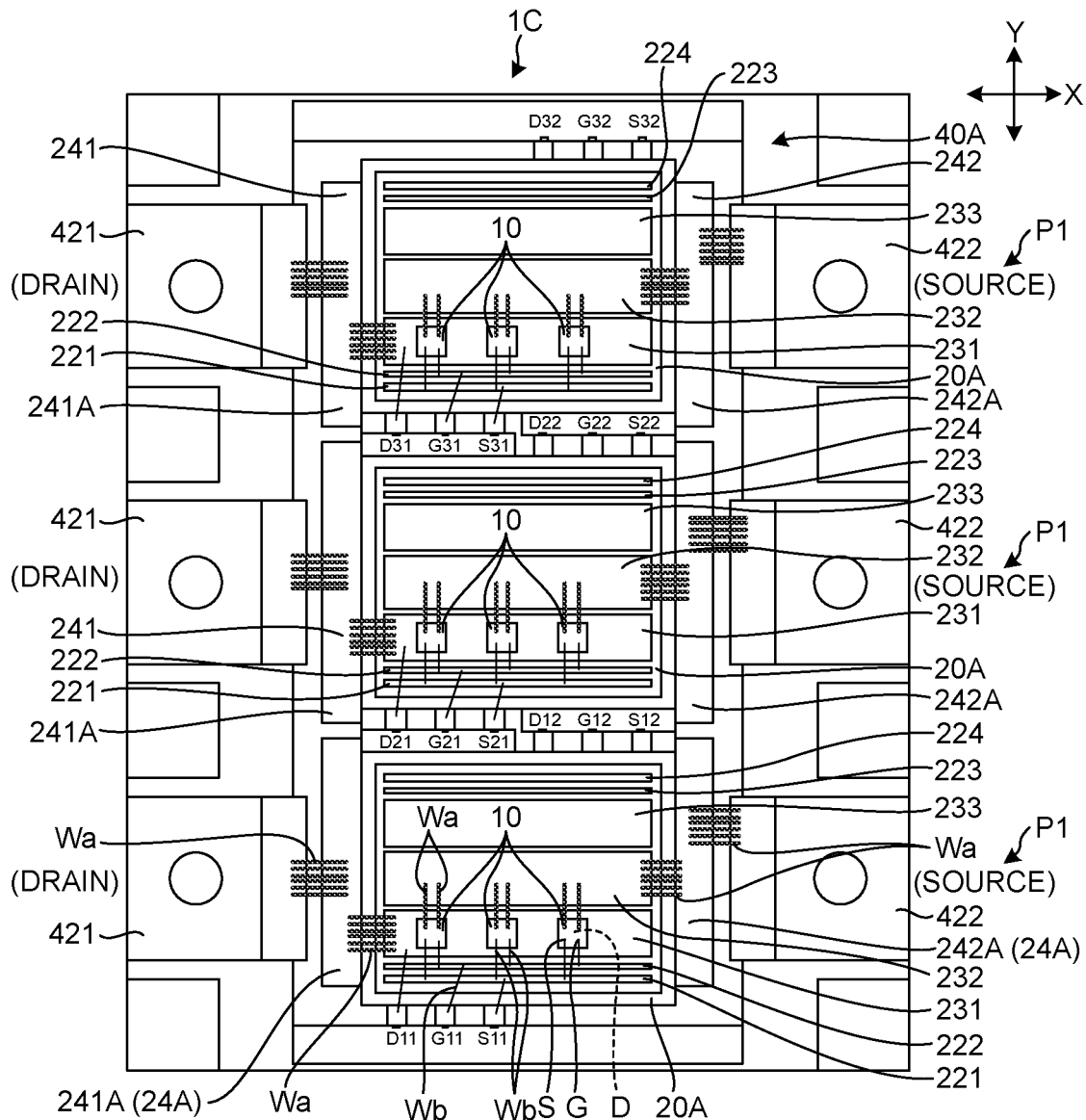
FIG.10
FIG.11
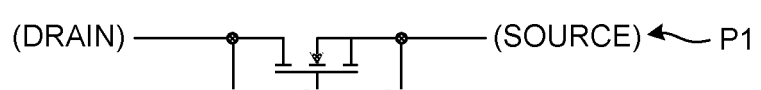
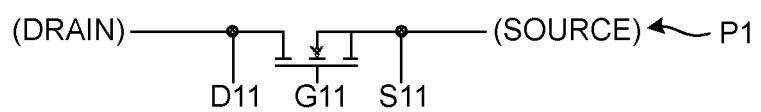

SEMICONDUCTOR MODULE

CROSS-REFERENCE TO RELATED APPLICATION(S)

The present application claims priority to and incorporates by reference the entire contents of Japanese Patent Application No. 2020-142370 filed in Japan on Aug. 26, 2020.

BACKGROUND OF THE INVENTION

1. Field of the Invention

The present invention relates to a semiconductor module.

2. Description of the Related Art

In the related art, as a semiconductor module, for example, Japanese Patent Application Laid-open No. H11-16937 discloses a power semiconductor module including a substrate and a case to which the substrate is assembled. In the power semiconductor module, for example, the case is provided with terminals for connecting to the substrate of an intelligent power module, thereby forming a common case to which both the substrates of the power module and the intelligent power module can be assembled and allowing the sharing of components.

However, in the power semiconductor module disclosed in Japanese Patent Application Laid-open No. H11-16937 described above, for example, since control is different between the power module and the intelligent power module, it is necessary to use substrates having different wiring patterns, and when the power semiconductor module is manufactured, it is necessary to prepare a plurality of substrates having different wiring patterns according to a circuit, which may reduce manufacturing efficiency.

SUMMARY OF THE INVENTION

Therefore, the present invention has been made in view of the above, and an object of the present invention is to provide a semiconductor module capable of properly sharing components.

In order to solve the above mentioned problem and achieve the object, a semiconductor module according to one aspect of the present invention includes semiconductor chips each provided with a drain portion on one of a pair of surfaces facing each other, and a source portion and a gate portion on the other surface; and substrates each including a base material, three power supply patterns provided on the base material and capable of transmitting power supplied from a power supply, and at least two signal patterns provided on the base material and capable of transmitting a control signal, the substrate being capable of mounting the semiconductor chips thereon, wherein the three power supply patterns and the two signal patterns extend in parallel to each other along a first direction, among the three power supply patterns, two of the three power supply patterns are capable of mounting the semiconductor chips thereon and connectable to the drain portions of the mounted semiconductor chips, and remaining one of the three power supply pattern is connectable to the source portions of the mounted semiconductor chips, and the two signal patterns are connectable to the gate portions of the mounted semiconductor chips.

According to still another aspect of the present invention, in the semiconductor module, it is preferable that in the three power supply patterns, the one power supply pattern connectable to the source portions is arranged along the second direction orthogonal to the first direction between the two power supply patterns capable of mounting the semiconductor chips, four signal patterns are provided, and two of the signal patterns are connectable to the gate portions, remaining two of the signal patterns are connectable to the source portions, the two signal patterns connectable to the gate portions are arranged in a pair along the second direction with the three power supply patterns interposed therebetween, and the two signal patterns connectable to the source portions are arranged in a pair along the second direction with the three power supply patterns interposed therebetween, and the two power supply patterns capable of mounting the semiconductor chips thereon are usable as signal patterns for the drain portions.

According to still another aspect of the present invention, in the semiconductor module, it is preferable that external connection patterns that are connectable to any one of the three power supply patterns, are connectable to an external connection partner located outside the substrates, extend along the second direction orthogonal to the first direction, and are provided in a pair along the first direction with at least the three power supply patterns interposed therebetween.

According to still another aspect of the present invention, in the semiconductor module, it is preferable that the semiconductor module includes a base part on which the substrates are placed; and a case assembled to the base part on which the substrates are placed, wherein the case includes a case body, power supply terminals provided on the case body and connectable to the power supply patterns, and signal terminals provided on the case body and connectable to the signal patterns.

According to still another aspect of the present invention, in the semiconductor module, it is preferable that among the three power supply patterns, one of the three power supply patterns is a power supply connection pattern for mounting the semiconductor chips thereon and is connected to the drain portions of the mounted semiconductor chips, another one of the three power supply patterns is a power supply connection pattern connected to the source portions of the mounted semiconductor chips, and remaining one of the three power supply patterns is a power supply non-connection pattern not connected to the drain portions, the source portions, and the gate portions of the mounted semiconductor chips, four signal patterns are provided, and one of the four signal patterns is a signal connection pattern connected to the gate portions of the mounted semiconductor chips, another one of the four signal patterns is a signal connection pattern connected to the source portions of the mounted semiconductor chips, and remaining two of the four signal patterns are signal non-connection patterns not connected to the drain portions, the source portions, and the gate portions of the mounted semiconductor chips, and the mounted semiconductor chips form a unidirectional circuit that energizes or interrupts a current flowing through the power supply patterns in one direction.

According to still another aspect of the present invention, in the semiconductor module, it is preferable that among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips, and four signal patterns are provided, and two of the four signal patterns are connected to the gate portion of any of the mounted semiconductor chips, and remaining two of the four signal patterns are connected to the source portion of any of the mounted semiconductor chips, and the mounted semiconductor chips form a bidirectional circuit that energizes or interrupts a current flowing through the power supply patterns in both directions.

According to still another aspect of the present invention, in the semiconductor module, it is preferable that external connection patterns that are connectable to any one of the three power supply patterns, are connectable to an external connection partner located outside the substrates, extend along the second direction orthogonal to the first direction, and are provided in a pair along the first direction with at least the three power supply patterns interposed therebetween, wherein three substrates, on which the semiconductor chips are mounted, are provided and are arranged side by side along the second direction, the adjacent substrates are connected to each other via the external connection patterns, in each of the substrates, among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips mounted on one of the three power supply patterns, one of the two power supply patterns connected to the drain portions is connected to the source portions of the mounted semiconductor chips mounted on the other of the two power supply patterns, and four signal patterns are provided, and two of the four signal patterns are connected to the gate portion of any of the mounted semiconductor chips, and remaining two of the four signal patterns are connected to the source portion of any of the mounted semiconductor chips, and the mounted semiconductor chips form an inverter circuit that converts DC power into AC power.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 10 is a plan view illustrating a configuration example of a semiconductor module according to a modification of the first embodiment;

FIG. 11 is a circuit diagram illustrating the configuration example of the semiconductor module according to the modification of the first embodiment;

DETAILED DESCRIPTION OF THE PREFERRED EMBODIMENTS

Modes (embodiments) for carrying out the present invention will be described in detail with reference to the drawings. The present invention is not limited by the content disclosed in the following embodiments. Furthermore, components disclosed below include those that can be easily assumed by those skilled in the art and those that are substantially the same. Furthermore, configurations disclosed below can be combined as appropriate. Furthermore, various omissions, substitutions, or changes of the configurations can be made without departing from the gist of the present invention.

First Embodiment

A semiconductor module 1 according to an embodiment will be described with reference to the drawings. First, a basic configuration of the semiconductor module 1 will be described, and then various variations of the semiconductor module 1 according to a configuration of a semiconductor chip 10 will be described.

Basic Configuration

Figure 1:
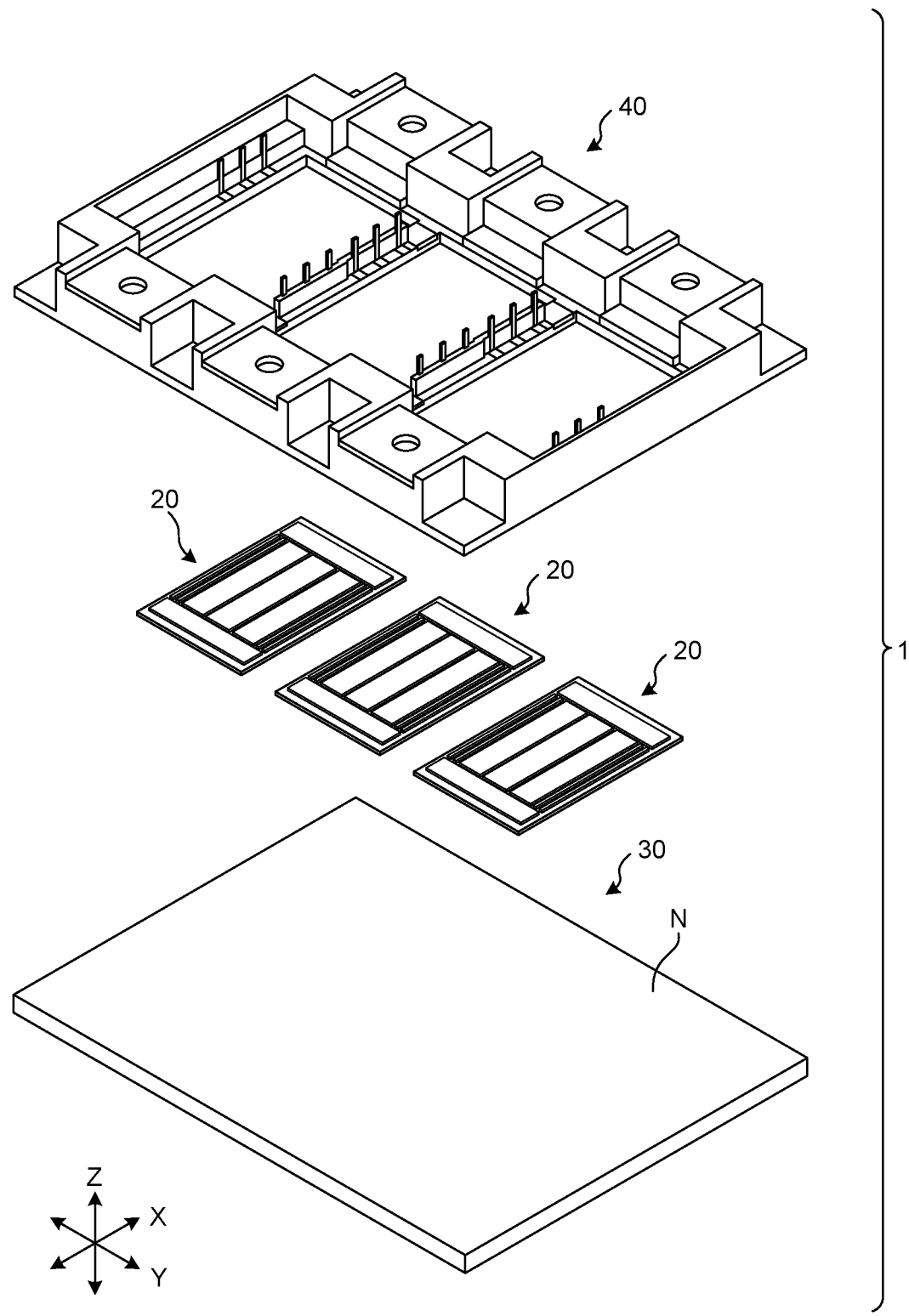
FIG. 1 is an exploded perspective view illustrating a basic configuration example of a semiconductor module according to a first embodiment.
Figure 2:
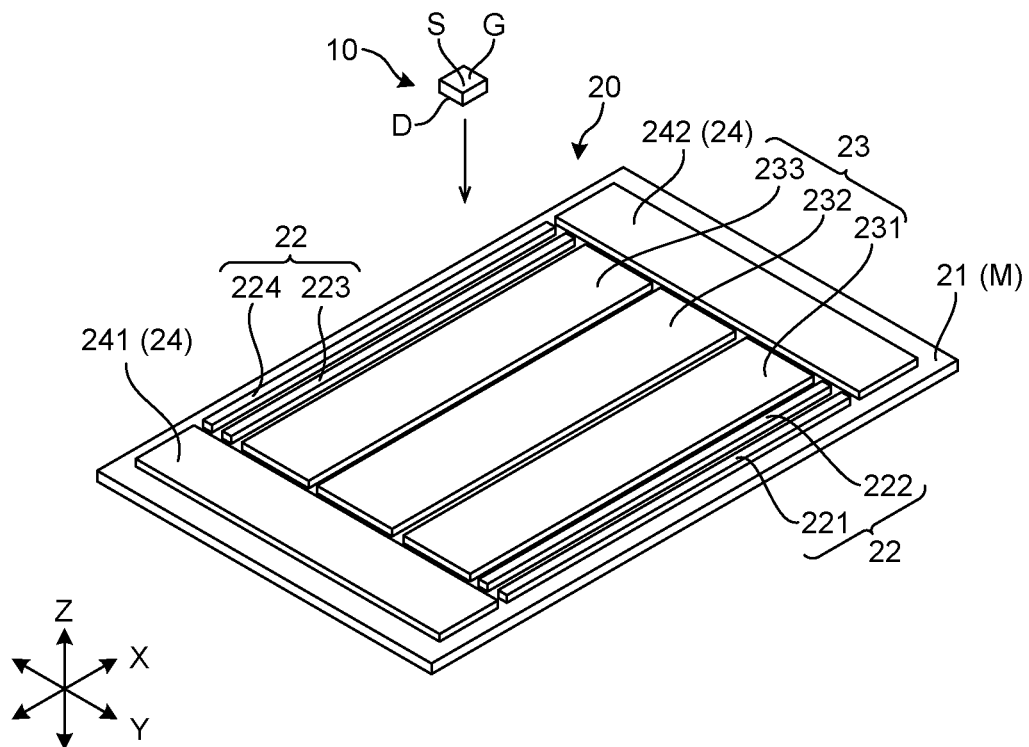
FIG. 2 is a perspective view illustrating a configuration example of a substrate according to the first embodiment.
Figure 3:
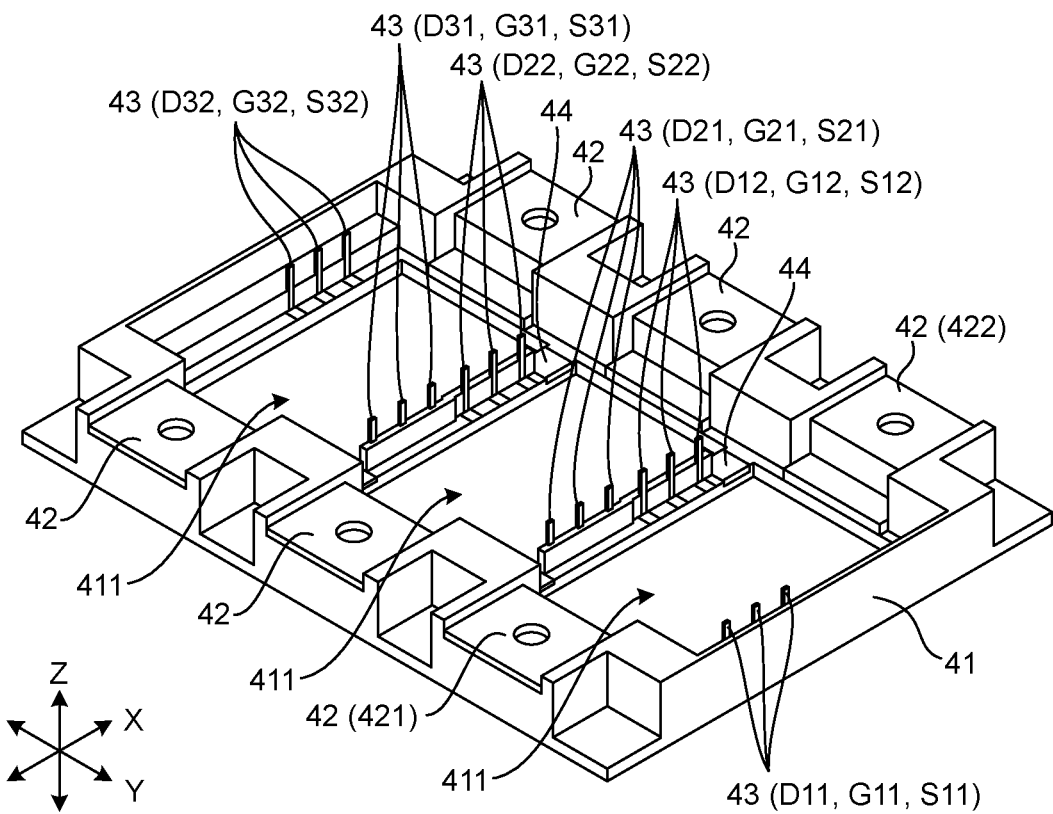
FIG. 3 is a perspective view illustrating a configuration example of a case according to the first embodiment.

FIG. 1 is an exploded perspective view illustrating a basic configuration example of the semiconductor module 1 according to the first embodiment. FIG. 2 is a perspective view illustrating a configuration example of a substrate 20 according to the first embodiment. FIG. 3 is a perspective view illustrating a configuration example of a case 40 according to the first embodiment. FIG. 1 to FIG. 3 illustrate a state in which no semiconductor chips 10 are mounted on the substrate 20.

As illustrated in FIG. 1 to FIG. 3, the basic configuration of the semiconductor module 1 includes semiconductor chips 10, substrates 20, a base part 30, and the case 40. Furthermore, the semiconductor module 1 constitutes various semiconductor circuits according to the configurations of the semiconductor chips 10 by mounting the semiconductor chips 10 (see FIG. 4 and the like) on the basic configuration.

In the present embodiment, a direction in which power supply patterns 23 and signal patterns 22 formed on a pattern forming surface M (see FIG. 2) of the substrate 20 extend is defined as a first direction X, a direction orthogonal to the first direction X on the pattern forming surface M of the substrate 20 is defined as a second direction Y, and a direction orthogonal to the pattern forming surface M of the substrate 20 is defined as a third direction Z. The first direction X, the second direction Y, and the third direction Z are orthogonal to each other.

The semiconductor chip 10 is for energizing or interrupting a current. The semiconductor chip 10 is, for example, an N-channel metal oxide semiconductor field effect transistor (MOSFET), and includes a drain portion D, a source portion S, and a gate portion G as illustrated in FIG. 2. The semiconductor chip 10 is provided with the drain portion D on one of a pair of surfaces thereof facing each other in the third direction Z, and the source portion S and the gate portion G on the other surface. The semiconductor chip 10 is mounted on one power supply pattern 23 in a state in which the drain portion D side abuts on the power supply pattern 23.

The substrate 20 constitutes an electric circuit. The substrate 20 includes base materials 21, the signal patterns 22, the power supply patterns 23, and external connection patterns 24.

The base material 21 is capable of mounting the semiconductor chip 10 thereon. The base material 21 is made of an insulating member such as resin, and is formed in a flat plate shape and a rectangular shape. The three base materials 21 are provided and have the same shape. Each of the base materials 21 has a pair of surface portions in the third direction Z, and the pattern forming surface M with each pattern is provided on one surface portion thereof. On the pattern forming surface M, four signal patterns 22, three power supply patterns 23, and two external connection patterns 24 are formed. In the base material 21, the semiconductor chips 10 are mounted on the power supply pattern 23 formed in the base material 21, according to a semiconductor circuit to be implemented.

The four signal patterns 22 (221 to 224) are conductive patterns capable of transmitting a control signal. The four signal patterns 22 are provided on the base material 21 and are formed in a liner shape. The four signal patterns 22 are formed in a straight-line shape and extend in parallel to each other along the first direction X. The four signal patterns 22 are all formed to have the same thickness, that is, width lengths in the second direction Y are formed to be the same, and are formed to be thinner than the three power supply patterns 23. The four signal patterns 22 (221 to 224) are all formed to have the same length in the first direction X, and the two signal patterns 221 and 222 and the remaining two signal patterns 223 and 224 are arranged in pairs along the second direction Y with the three power supply patterns 23 interposed therebetween. In other words, in the four signal patterns 22, the two signal patterns 221 and 222 are arranged side by side on one side of the three power supply patterns 23 along the second direction Y, and the remaining two signal patterns 223 and 224 are arranged side by side on the other side of the three power supply patterns 23 along the second direction Y. In the four signal patterns 22, the positions of respective ends thereof on one side in the first direction X are aligned and the positions of respective ends thereof on the other side in the first direction X are also aligned. In the four signal patterns 22, two signal patterns 22 are connectable to the gate portion G of the semiconductor chip 10, and the remaining two signal patterns 22 are connectable to the source portion S of the semiconductor chip 10. In the four signal patterns 22 (221 to 224), for example, the two signal patterns 222 and 223 connectable to the gate portion G are arranged in a pair along the second direction Y with the three power supply patterns 23 interposed therebetween, and the two signal patterns 221 and 224 connectable to the source portion S are arranged in a pair along the second direction Y with the three power supply patterns 23 interposed therebetween. Specifically, in the four signal patterns 22 (221 to 224), the two signal patterns 222 and 223 located on the inside (the three power supply patterns 23 side) in the second direction Y are connectable to the gate portion G of the semiconductor chip 10, and the two signal patterns 221 and 224 located on the outside (opposite side of the three power supply patterns 23) in the second direction Y are connectable to the source portion S of the semiconductor chip 10.

The three power supply patterns 23 (231 to 233) are conductive patterns capable of transmitting power supplied form a power supply. The three power supply patterns 23 are provided on the base material 21 and are formed in a liner shape. The three power supply patterns 23 are formed in a straight-line shape and extend in parallel to each other along the first direction X. Furthermore, the three power supply patterns 23 and the two signal patterns 22 extend in parallel to each other along the first direction X. The three power supply patterns 23 are all formed to have the same thickness, that is, width lengths in the second direction Y are formed to be the same, and are formed to be thicker than the four signal patterns 22 are. The three power supply patterns 23 are all formed to have the same length in the first direction X, and in this example, are formed to have the same length as those of the four signal patterns 22 in the first direction X. The three power supply patterns 23 are arranged to be interposed between the pair of signal patterns 221 and 222 and the pair of remaining signal patterns 223 and 224 in the second direction Y. In the three power supply patterns 23, the positions of respective ends thereof on the one side in the first direction X are aligned and the positions of respective ends thereof on the other side in the first direction X are also aligned. Furthermore, in the three power supply patterns 23, the positions of the respective ends thereof on the one side in the first direction X are aligned with the positions of the respective ends of the four signal patterns 22 on the one side in the first direction X, and the positions of the respective ends thereof on the other side in the first direction X are also aligned with the positions of the respective ends of the four signal patterns 22 on the other side in the first direction X. The three power supply patterns 23 are each composed of a first power supply pattern 231, a second power supply pattern 232, and a third power supply pattern 233 sequentially along the second direction Y. The first and third power supply patterns 231 and 233 are power supply connection patterns for drain, which are capable of mounting the semiconductor chip 10 thereon and connectable to the drain portion D of the mounted semiconductor chip 10. The second power supply pattern 232 is a power supply connection pattern for source, which is connectable to the source portion S of the mounted semiconductor chip 10 thereon. In the three power supply patterns 23, the two first and third power supply patterns 231 and 233 capable of mounting the semiconductor chip 10 thereon are arranged on both sides along the second direction Y, respectively, and the second power supply pattern 232 connectable to the source portions S of the semiconductor chips 10 is arranged in the center along the second direction Y. In other words, in three power supply patterns 23 (231 to 233), the one second power supply pattern 232 connectable to the source portion S is arranged along the second direction Y between the two first and third power supply patterns 231 and 233 capable of mounting the semiconductor chip 10 thereon. The two first and third power supply patterns 231 and 233 capable of mounting the semiconductor chip 10 thereon can also be used as the signal patterns 22 for the drain portion D.

The two external connection patterns 24 are conductive patterns capable of transmitting the power supplied form the power supply. The two external connection patterns 24 are provided on the base material 21 and are formed in a liner shape. The two external connection patterns 24 are formed in a straight-line shape and extend in parallel to each other along the second direction Y. The two external connection patterns 24 are all formed to have the same thickness, that is, width lengths in the first direction X are formed to be the same, and are formed to have the same thickness as those of the three power supply patterns 23 described above. The two external connection patterns 24 are all formed to have the same length in the second direction Y, and are provided in a pair along the first direction X with at least three power supply patterns 23 interposed therebetween. Typically, the two external connection patterns 24 are provided in a pair along the first direction X with the three power supply patterns 23 and the four signal patterns 22 interposed therebetween. In other words, in the two external connection patterns 24 (241 and 242), the first external connection pattern 241 is arranged on one side of the three power supply patterns 23 and the four signal patterns 22 in the first direction X, and the second external connection pattern 242 is arranged on the other side of the three power supply patterns 23 and the four signal patterns 22 in the first direction X. In the two external connection patterns 24, the positions of respective ends thereof on one side in the second direction Y are aligned and the positions of respective ends thereof on the other side in the second direction Y are also aligned. The two external connection patterns 24 are connectable to any one of the three power supply patterns 23 and are connectable to external connection partners (power supply terminals 42 to be described later and other external connection patterns 24) located outside the substrate 20.

The base part 30 is for placing three substrates 20 thereon. The base part 30 is made of a metal member having thermal conductivity and is formed in a flat plate shape and a rectangular shape. Since the base part 30 has thermal conductivity, it is possible to efficiently dissipate heat generated by the semiconductor chips 10 mounted on the substrates 20. The base part 30 has a pair of surface portions in the third direction Z, and a substrate mounting surface N (see FIG. 1) on which the three substrates 20 and the case 40 are mounted is provided on one surface portion thereof.

The case 40 is a housing that accommodates the substrates 20 on which the semiconductor chips 10 are mounted. The case 40 includes a case body 41, the power supply terminals 42, signal terminals 43, and relay terminals 44.

The case body 41 is made of an insulating member such as resin and has three accommodating parts 411. The three accommodating parts 411 are each formed in a rectangular shape according to the outer shape of the substrate 20, and are arranged side by side along the second direction Y. Each of the three accommodating parts 411 individually accommodates the substrate 20.

The power supply terminals 42 are terminals connected to a power supply system and are provided on the case body 41.

The power supply terminals 42 include first terminals 421 and second terminals 422. One first terminal 421 and one second terminal 422 are provided to one accommodating part 411 of the case body 41. Each of the first terminals 421 is provided on one side of the one accommodating part 411 in the first direction X. Each of the second terminals 422 is provided on the other side of the one accommodating part 411 in the first direction X. The first terminal 421 and the second terminal 422 are provided for each of the three accommodating parts 411. The first terminals 421 and the second terminals 422 are connectable to the power supply patterns 23, and, for example, the first terminals 421 are connected to a positive electrode of the power supply and the power supply patterns 23, and the second terminals 422 are connected to a load unit and the power supply patterns 23.

The signal terminals 43 are terminals connected to a control system and are provided on the case body 41. Six signal terminals 43 are provided to, for example, one accommodating part 411 of the case body 41. The six signal terminals 43 (D11, G11, S11, D12, G12, and S12) are provided for each of the three accommodating parts 411. In the six signal terminals 43, the three signal terminals 43 (D11, G11, and S11) are provided on one side of one accommodating part 411 in the second direction Y, and the remaining three signal terminals 43 (D12, G12, and S12) are provided on the other side of the one accommodating part 411 in the second direction Y. The six signal terminals 43 are connectable to the signal patterns 22.

The relay terminals 44 are terminals that connect adjacent substrates 20 to each other. The relay terminals 44 are provided on the case 40 and are arranged between the adjacent substrates 20 in the second direction Y. The relay terminals 44 are arranged between, for example, the external connection pattern 24 of the central substrate 20 and the external connection pattern 24 of the substrate 20 located on one side of the central substrate 20 in the second direction Y. Furthermore, the relay terminals 44 are arranged between the external connection pattern 24 of the central substrate 20 and the external connection pattern 24 of the substrate 20 located on the other side of the central substrate 20 in the second direction Y. The relay terminals 44 connect the adjacent substrates 20 to each other via the external connection patterns 24. The case 40 configured as described above is assembled to the base part 30 on which the substrates 20 are placed. For example, the case 40 is bonded and fixed to the base part 30. Furthermore, in the semiconductor module 1, in a state in which the substrates 20, on which the semiconductor chips 10 are mounted, and the case 40 are assembled to the base part 30, the semiconductor chips 10 and the like on the substrates 20 are sealed with resin.

First Variation

Figure 4:
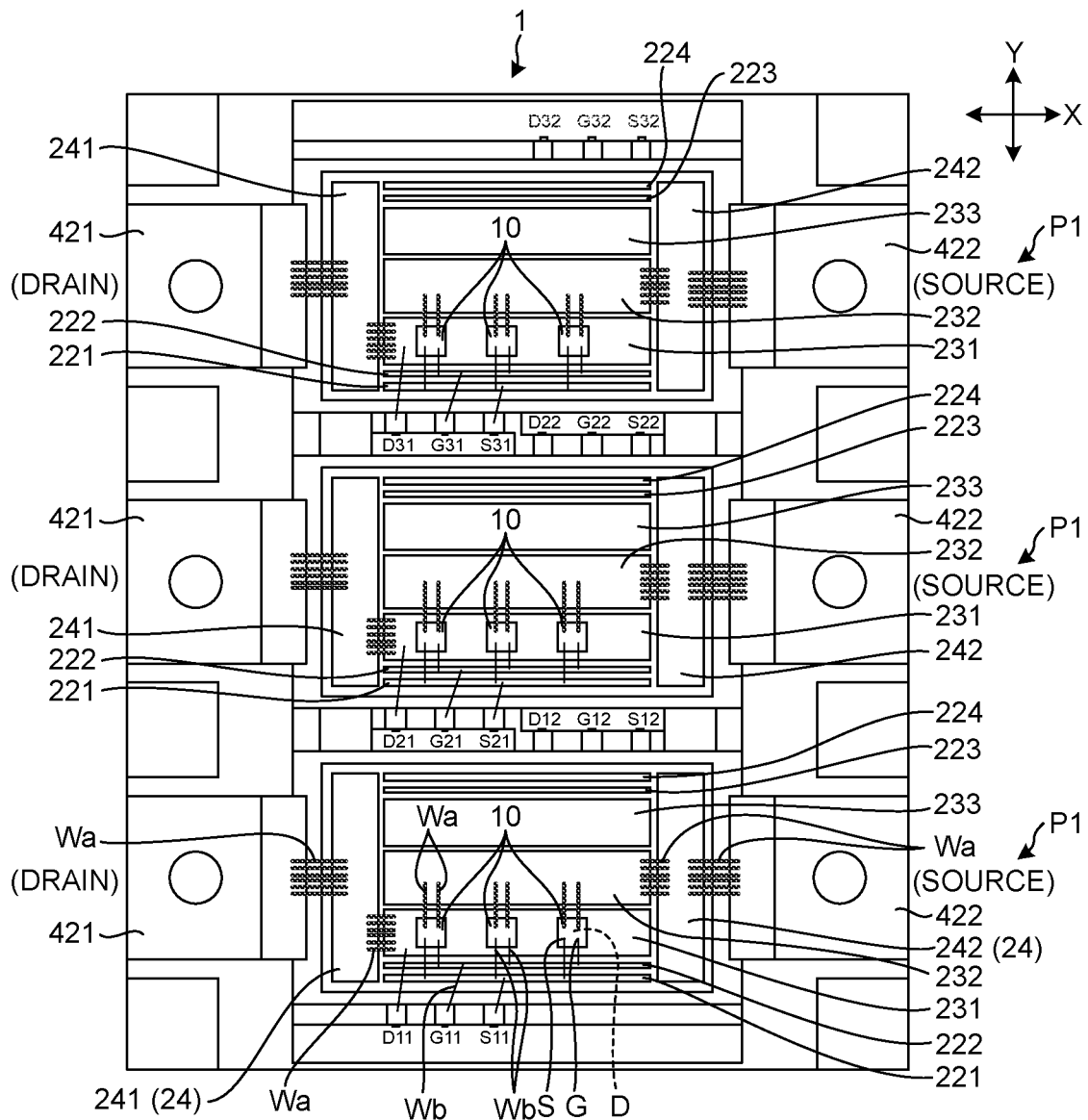
FIG. 4 is a plan view illustrating a configuration example (first variation) of the semiconductor module according to the first embodiment.
Figure 5:
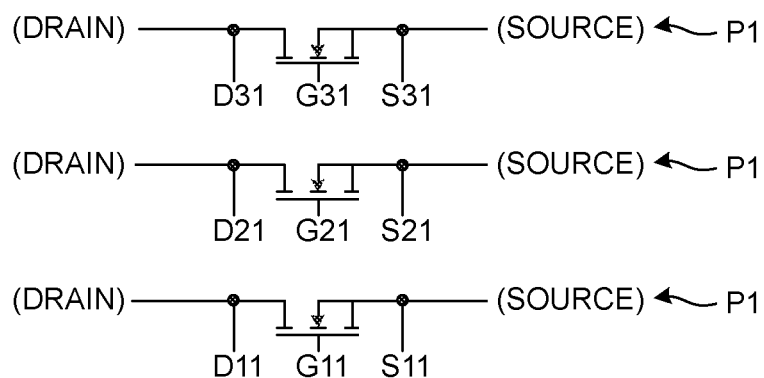
FIG. 5 is a circuit diagram illustrating the configuration example (first variation) of the semiconductor module according to the first embodiment.

Next, an example in which the semiconductor chips 10 are mounted on the substrates 20 described in the aforementioned basic configuration to form a unidirectional circuit P1 will be described. FIG. 4 is a plan view illustrating a configuration example (first variation) of the semiconductor module 1 according to the first embodiment. FIG. 5 is a circuit diagram illustrating the configuration example (first variation) of the semiconductor module 1 according to the first embodiment. Note that in the circuit diagram of FIG. 5, the configuration example of the semiconductor module 1 illustrated in FIG. 4 is simplified and illustrated.

The semiconductor module 1 illustrated in FIG. 4 is provided, for example, in the power supply system of a vehicle, and energizes or interrupts a current flowing in a single direction (one direction) from the power supply of the vehicle to the load unit. The semiconductor module 1 includes the semiconductor chips 10, the substrates 20, the base part 30, and the case 40. The semiconductor module 1 can be arranged at various locations in the power supply system of the vehicle. For example, when the semiconductor module 1 is arranged between a positive side of the power supply and the load unit, the first terminals 421 of the power supply terminals 42 are connected to the positive side of the power supply of the vehicle, and the second terminals 422 of the power supply terminals 42 are connected to the load unit. Furthermore, when the semiconductor module 1 is arranged between a negative side of the power supply and the load unit, the first terminals 421 of the power supply terminals 42 are connected to the load unit, and the second terminals 422 of the power supply terminals 42 are connected to the negative side of the power supply of the vehicle. Furthermore, in the semiconductor module 1, each of the first terminals 421 of the power supply terminals 42 is connected to the first external connection pattern 241 via a wire Wa, and each of the second terminals 422 of the power supply terminals 42 is connected to the second external connection pattern 242 via a wire Wa. Furthermore, in the semiconductor module 1, the first external connection pattern 241 is connected to the first power supply pattern 231 via a wire Wa, and the second external connection pattern 242 is connected to the second power supply pattern 232 via a wire Wa.

Three semiconductor chips (mounted semiconductor chips) 10 are mounted on one power supply pattern 23, and the semiconductor chips 10 are connected in parallel to the power supply pattern 23. For example, each of the three semiconductor chips 10 is mounted on the first power supply pattern 231, and the drain portion D of each of the three semiconductor chips 10 is directly connected to the first power supply pattern 231, and the source portion S of each of the three semiconductor chips 10 is connected to the second power supply pattern 232 via a wire Wa. In order words, in the three power supply patterns 23, the one, first power supply pattern 231 is a power supply connection pattern for mounting the semiconductor chip 10 thereon and is connected to the drain portion D of the mounted semiconductor chip 10, and another one, the second power supply pattern 232 is a power supply connection pattern connected to the source portion S of the semiconductor chip 10 via the wire Wa. Furthermore, the remaining one, the third power supply pattern 233 is a power supply non-connection pattern not connected to the drain portion D, the source portion S, and the gate portion G of the semiconductor chip 10. That is, no current flows through the third power supply pattern 233, which is the power supply non-connection pattern, when power is supplied from the power supply to the load unit.

Furthermore, in the three semiconductor chips 10, each of the source portions S is connected to the signal pattern 221 for source via a wire Wb, and each of the gate portions G is connected to the signal pattern 222 for gate via a wire Wb. In other words, in the signal patterns 22, the one signal pattern 222 is a signal connection pattern connected to the gate portion G of each of the semiconductor chip 10, and another one signal pattern 221 is a signal connection pattern connected to the source portion S of each of the semiconductor chip 10.

Furthermore, the remaining two signal patterns 222 and 223 are signal non-connection patterns not connected to the drain portion D, the source portion S, and the gate portion G. Furthermore, a control signal flows through the two signal patterns 221 and 222, which are the signal connection patterns, when each of the semiconductor chips 10 is controlled, and no control signal flows through the two signal patterns 223 and 224, which are the signal non-connection patterns, when each of the semiconductor chips 10 is controlled.

The signal pattern 221 for source is connected to the signal terminal S11 (S21 and S31) for source of the case 40 via the wire Wb, and the signal pattern 222 for gate is connected to the signal terminal G11 (G21 and G31) for gate of the case 40 via the wire Wb. The first power supply pattern 231 is connected to the signal terminal D11 (D21 and D31) for drain of the case 40 via a wire Wb. The signal terminals S11 (S21 and S31), D11 (D21 and D31), and G11 (G21 and G31) of the case 40 are connected to an external control unit (not illustrated). Each of the semiconductor chips 10 forms the unidirectional circuit P1 (see FIG. 5) that energizes or interrupts a current flowing through the power supply patterns 23 in one direction, according to a control signal output from the control unit. For example, each of the semiconductor chips 10 energizes or interrupts a current flowing through the power supply patterns 23 in one direction, according to a voltage (control signal) applied to the gate portion G by the control unit.

Note that in the semiconductor module 1 illustrated in FIG. 4, three substrates 20 on which the semiconductor chips 10 are mounted are accommodated in the case 40, and the same three unidirectional circuits P1 are formed. Furthermore, since the substrates 20 have the same configuration, detailed description of the individual substrates 20 will be omitted.

Second Variation

Figure 6:
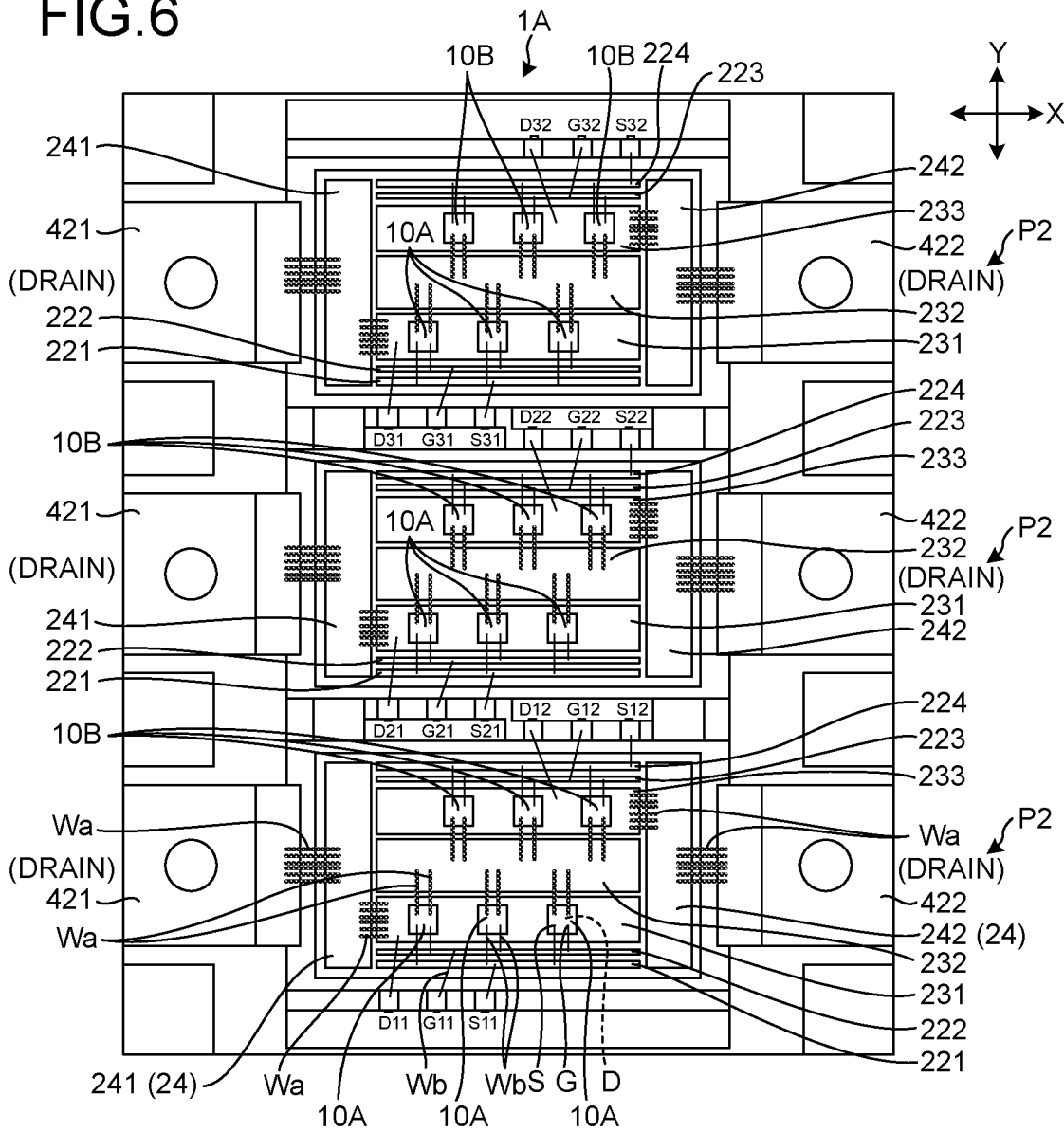
FIG. 6 is a plan view illustrating a configuration example (second variation) of a semiconductor module according to the first embodiment.
Figure 7:
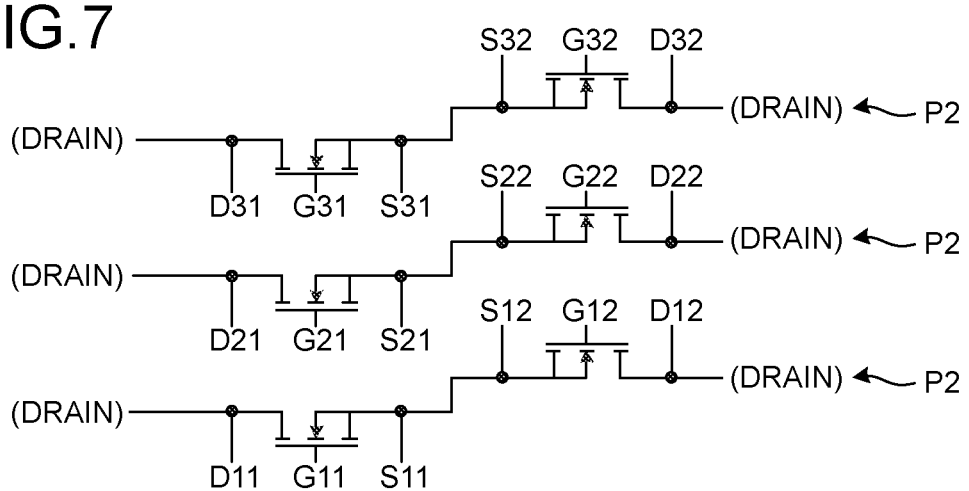
FIG. 7 is a circuit diagram illustrating the configuration example (second variation) of the semiconductor module according to the first embodiment.

Next, a semiconductor module 1A according to a second variation will be described. The semiconductor module 1A is different from the semiconductor module 1 according to the first variation in that it forms a bidirectional circuit P2. FIG. 6 is a plan view illustrating a configuration example (second variation) of the semiconductor module 1A according to the first embodiment. FIG. 7 is a circuit diagram illustrating the configuration example (second variation) of the semiconductor module 1A according to the first embodiment. Note that in the circuit diagram of FIG. 7, the configuration example of the semiconductor module 1A illustrated in FIG. 6 is simplified and illustrated.

The semiconductor module 1A illustrated in FIG. 6 is provided, for example, in the power supply system of the vehicle, and energizes or interrupts a current flowing in both directions between the power supply of the vehicle and the load unit. The semiconductor module 1A includes semiconductor chips 10A and 10B, the substrates 20, the base part 30, and the case 40. In the semiconductor module 1A, the first terminals 421 of the power supply terminals 42 are connected to the power supply of the vehicle and the second terminals 422 of the power supply terminals 42 are connected to the load unit. In the semiconductor module 1A, the first terminals 421 of the power supply terminals 42 are connected to the first external connection pattern 241 via the wire Wa, and the second terminals 422 of the power supply terminals 42 are connected to the second external connection pattern 242 via the wire Wa. In the semiconductor module 1A, the first external connection pattern 241 is connected to the first power supply pattern 231 via the wire Wa, and the second external connection pattern 242 is connected to the third power supply pattern 233 via the wire Wa.

Six semiconductor chips 10A and 10B as mounted semiconductor chips are mounted on the power supply patterns 23, and among them, three semiconductor chips 10A are connected in parallel to one power supply pattern 23 and the remaining three semiconductor chips 10B are connected in parallel to another power supply pattern 23. For example, each of the three semiconductor chips 10A is mounted on the first power supply pattern 231, the drain portion D of each of the three semiconductor chips 10A is directly connected to the first power supply pattern 231, and the source portion S of each of the three semiconductor chips 10A is connected to the second power supply pattern 232 via the wire Wa. Furthermore, each of the remaining three semiconductor chips 10B is mounted on the third power supply pattern 233, the drain portion D of each of the three semiconductor chips 10B is directly connected to the third power supply pattern 233, and the source portion S of each of the three semiconductor chips 10B is connected to the second power supply pattern 232 via the wire Wa. In order words, in the three power supply patterns 23, the two first and third power supply patterns 231 and 233 mount the semiconductor chips 10A and 10B thereon and are connected to the drain portions D of the mounted semiconductor chips 10A and 10B, and the remaining one second power supply pattern 232 is connected to the source portions S of the semiconductor chips 10A and 10B via the wire Wa. Furthermore, the three power supply patterns 23 do not include power supply non-connection patterns not connected to the drain portions D, the source portions S, and the gate portions G of the semiconductor chips 10A and 10B, and all the power supply patterns 23 are power supply connection patterns connected to at least one of the drain portions D, the source portions S, and the gate portions G of the semiconductor chips 10A and 10B.

In the three semiconductor chips 10A, each of the source portions S is connected to the signal pattern 221 for source via the wire Wb, and each of the gate portions G is connected to the signal pattern 222 for gate via the wire Wb. Furthermore, in the remaining three semiconductor chips 10B, each of the source portions S is connected to the signal pattern 224 for source via the wire Wb, and each of the gate portions G is connected to the signal pattern 223 for gate via the wire Wb. In other words, in the signal patterns 22, the two signal patterns 222 and 223 are connected to any one of the gate portions G of the semiconductor chips 10A and 10B, and the remaining two signal patterns 221 and 224 are connected to any one of the source portion S of the semiconductor chips 10A and 10B. Furthermore, the four signal patterns 22 do not include signal non-connection patterns not connected to the drain portions D, the source portions S, and the gate portions G, and all the signal patterns 22 are signal connection patterns connected to any one of the drain portions D, the source portions S, and the gate portions G.

The signal pattern 221 for source is connected to the signal terminal S11 (S21 and S31) for source of the case 40 via the wire Wb, and the signal pattern 222 for gate is connected to the signal terminal G11 (G21 and G31) for gate of the case 40 via the wire Wb. Furthermore, the signal pattern 224 for source is connected to the signal terminal S12 (S22 and S32) for source of the case 40 via the wire Wb, and the signal pattern 223 for gate is connected to the signal terminal G12 (G22 and G32) for gate of the case 40 via the wire Wb.

The first power supply pattern 231 is connected to the signal terminal D11 (D21 and D31) for drain of the case 40 via the wire Wb. Furthermore, the third power supply pattern 233 is connected to the signal terminal D12 (D22 and D32) for drain of the case 40 via the wire Wb. The signal terminals S1*l* and S12 (S21, S22, S31, and S32), D1*l* and D12 (D21, D22, D31, and D32), and G11 and G12 (G21, G22, G31, and G32) of the case 40 are connected to the external control unit (not illustrated). Each of the semiconductor chips 10A and 10B forms the bidirectional circuit P2 (see FIG. 7) that energizes or interrupts a current flowing through the power supply patterns 23 in both directions, according to a control signal output from the control unit. For example, each of the semiconductor chips 10A and 10B energizes or interrupts a current flowing through the power supply patterns 23 in both directions, according to a voltage (control signal) applied to the gate portion G by the control unit.

Note that in the semiconductor module 1A illustrated in FIG. 6, each of the three substrates 20 on which the semiconductor chips 10A and 10B are mounted is accommodated in the case 40, and the same three bidirectional circuit P2 are formed. Furthermore, since the substrates 20 have the same configuration, detailed description of the individual substrates 20 will be omitted.

Third Variation

Figure 8:
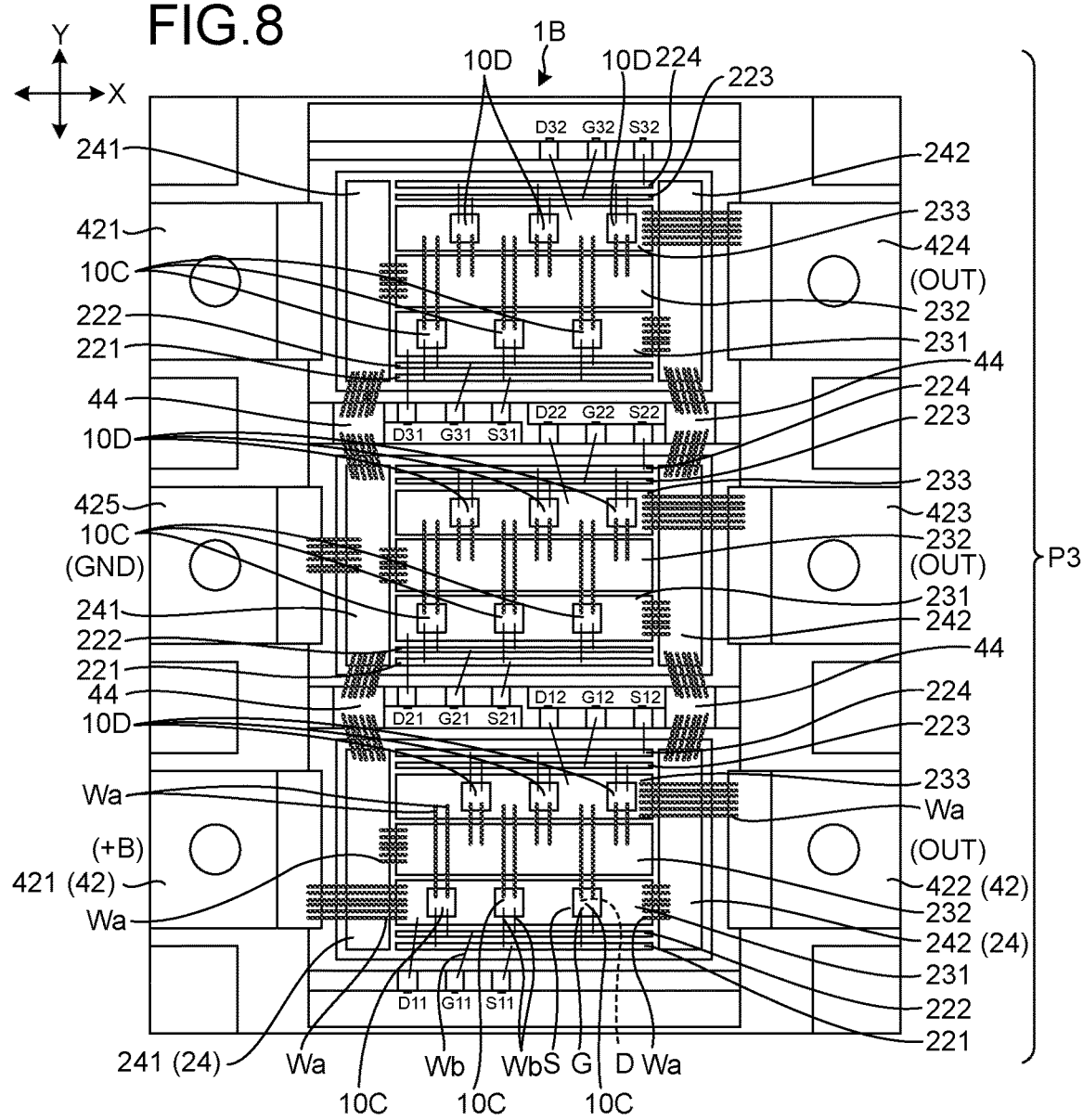
FIG. 8 is a plan view illustrating a configuration example (third variation) of a semiconductor module according to the first embodiment.
Figure 9:
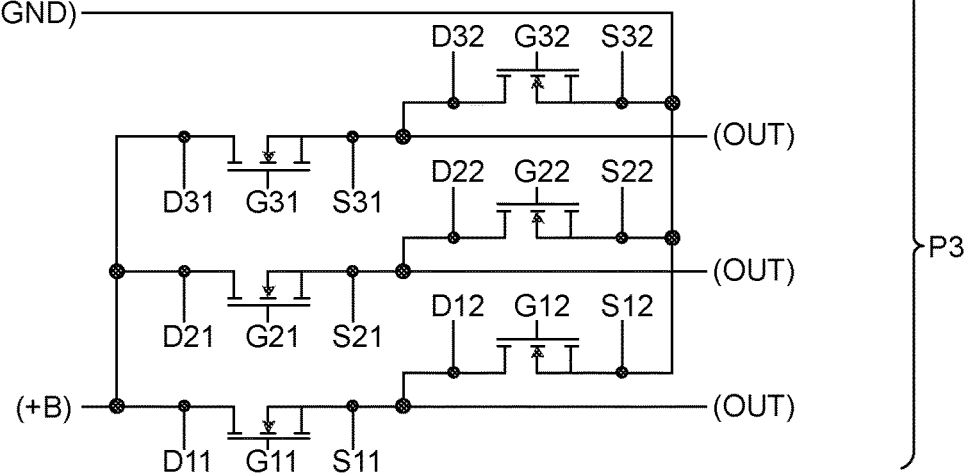
FIG. 9 is a circuit diagram illustrating the configuration example (third variation) of the semiconductor module according to the first embodiment.

Next, a semiconductor module 1B according to a third variation will be described. The semiconductor module 1B is different from the semiconductor modules 1 and 1A according to the first and second variations in that it forms a 3-phase inverter circuit P3. FIG. 8 is a plan view illustrating a configuration example (third variation) of the semiconductor module 1B according to the first embodiment. FIG. 9 is a circuit diagram illustrating the configuration example (third variation) of the semiconductor module 1B according to the first embodiment.

The semiconductor module 1B illustrated in FIG. 8 is provided, for example, in the power supply system of the vehicle, and converts direct current (DC) power supplied from the power supply of the vehicle into alternating current (AC) power. The semiconductor module 1B includes a plurality of semiconductor chips 10C and 10D, three substrates 20, the base part 30, and the case 40. In the semiconductor module 1B, the three substrates 20 each having the semiconductor chips 10C and 10D mounted thereon are arranged side by side along the second direction Y. In the semiconductor module 1B, in the power supply terminals 42 of the case 40, the first terminals 421 are connected to a positive electrode +B of the power supply of the vehicle; the second terminal 422, a third terminal 423, and a fourth terminal 424 are connected to input terminals of the load unit; and a fifth terminal 425 is connected to the ground GND. In the semiconductor module 1B, the first terminals 421 are connected to the first power supply pattern 231 and the second terminal 422 is connected to the third power supply pattern 233. In the semiconductor module 1B, the first power supply pattern 231 is connected to the second external connection pattern 242 and the second power supply pattern 232 is connected to the first external connection pattern 241. In the semiconductor module 1B, adjacent substrates 20 are connected to each other via the external connection patterns 24. That is, in the semiconductor module 1B, the first external connection pattern 241 is connected to the first external connection pattern 241 of an adjacent substrate 20 via relay terminals 44, and the second external connection pattern 242 is connected to the second external connection pattern 242 of the adjacent substrate 20 via other relay terminals 44.

Six semiconductor chips 10C and 10D are mounted on the power supply patterns 23 on a first substrate 20 (substrate 20 on the one side in the second direction Y), and among them, three semiconductor chips 10C are connected in parallel to the power supply pattern 23 and the remaining three semiconductor chips 10D are connected in parallel to another power supply pattern 23. For example, each of the three semiconductor chips 10C is mounted on the first power supply pattern 231, the drain portion D of each of the three semiconductor chips 10C is directly connected to the first power supply pattern 231, and the source portion S of each of the three semiconductor chips 10C is connected to the third power supply pattern 233 via the wire Wa. Furthermore, each of the remaining three semiconductor chips 10D is mounted on the third power supply pattern 233, the drain portion D of each of the three semiconductor chips 10D is directly connected to the third power supply pattern 233, and the source portion S of each of the three semiconductor chips 10D is connected to the second power supply pattern 232 via the wire Wa. In order words, in the three power supply patterns 23, the two first and third power supply patterns 231 and 233 mount the semiconductor chips 10C and 10D thereon and are each connected to the drain portions D of the mounted semiconductor chips 10C and 10D, and the remaining one second power supply pattern 232 is connected to the source portions S of the semiconductor chips 10D mounted on the one third power supply pattern 233. Furthermore, in the three power supply patterns 23, out of the two first and third power supply patterns 231 and 233 connected to the drain portions D, the one, the third power supply pattern 233 is connected to the source portion S of the semiconductor chip 10C mounted on another one first power supply pattern 231.

In the three semiconductor chips 10C, each of the source portions S is connected to the signal pattern 221 for source via the wire Wb, and each of the gate portions G is connected to the signal pattern 222 for gate via the wire Wb. Furthermore, in the remaining three semiconductor chips 10D, each of the source portions S is connected to the signal pattern 224 for source via the wire Wb, and each of the gate portions G is connected to the signal pattern 223 for gate via the wire Wb. In other words, in the signal patterns 22, the two signal patterns 222 and 223 are connected to the gate portions G of the semiconductor chips 10, and the remaining two signal patterns 221 and 224 are connected to the source portions S of the semiconductor chips 10.

The signal pattern 221 for source is connected to the signal terminals S11 for source of the case 40 via the wire Wb, and the signal pattern 222 for gate is connected to the signal terminals G11 for gate of the case 40 via the wire Wb. Furthermore, the signal pattern 224 for source is connected to the signal terminals S12 for source of the case 40 via the wire Wb, and the signal pattern 223 for gate is connected to the signal terminals G12 for gate of the case 40 via the wire Wb.

The first power supply pattern 231 is connected to the signal terminals D11 for drain of the case 40 via the wire Wb. Furthermore, the third power supply pattern 233 is connected to the signal terminals D12 for drain of the case 40 via the wire Wb. The signal terminals S11, S12, D11, D12, G11, and G12 of the case 40 are connected to the external control unit (not illustrated).

A substrate 20 different from the first substrate 20 described above is also configured in the same manner as the substrate 20 described above. That is, in a second substrate 20 (central substrate 20 in the second direction Y), six semiconductor chips 10C and 10D are mounted on the power supply patterns 23, and among them, three semiconductor chips 10C are connected in parallel to the power supply pattern 23 and the remaining three semiconductor chips 10D are connected in parallel to another power supply pattern 23. Since the connection relation between the semiconductor chips 10C and 10D is the same as that in the first substrate 20 described above, detailed description thereof will be omitted.

The signal pattern 221 for source is connected to the signal terminals S21 for source of the case 40 via the wire Wb, and the signal pattern 222 for gate is connected to the signal terminals G21 for gate of the case 40 via the wire Wb. Furthermore, the signal pattern 224 for source is connected to the signal terminals S22 for source of the case 40 via the wire Wb, and the signal pattern 223 for gate is connected to the signal terminals G22 for gate of the case 40 via the wire Wb.

The first power supply pattern 231 is connected to the signal terminals D21 for drain of the case 40 via the wire Wb. Furthermore, the third power supply pattern 233 is connected to the signal terminals D22 for drain of the case 40 via the wire Wb. The signal terminals S21, S22, D21, D22, G21, and G22 of the case 40 are connected to the external control unit (not illustrated).

A third substrate 20 different from the first and second substrates 20 described above is also configured in the same manner as the first and second substrates 20 described above. That is, in the third substrate 20 (substrate 20 on the other side in the second direction Y), six semiconductor chips 10C and 10D are mounted on the power supply patterns 23, and among them, three semiconductor chips 10C are connected in parallel to the power supply pattern 23 and the remaining three semiconductor chips 10D are connected in parallel to another power supply pattern 23. Since the connection relation between the semiconductor chips 10C and 10D is the same as that in the first substrate 20 described above, detailed description thereof will be omitted.

The signal pattern 221 for source is connected to the signal terminals S31 for source of the case 40 via the wire Wb, and the signal pattern 222 for gate is connected to the signal terminals G31 for gate of the case 40 via the wire Wb. Furthermore, the signal pattern 224 for source is connected to the signal terminals S32 for source of the case 40 via the wire Wb, and the signal pattern 223 for gate is connected to the signal terminals G32 for gate of the case 40 via the wire Wb.

The first power supply pattern 231 is connected to the signal terminals D31 for drain of the case 40 via the wire Wb. Furthermore, the third power supply pattern 233 is connected to the signal terminals D32 for drain of the case 40 via the wire Wb. The signal terminals S31, S32, D31, D32, G31, and G32 of the case 40 are connected to the external control unit (not illustrated). Each of the semiconductor chips 10C and 10D forms the inverter circuit P3 (see FIG. 9) that converts DC power into AC power according to a control signal output from the control unit. For example, each of the semiconductor chips 10C and 10D converts DC power into AC power according to a voltage (control signal) applied to the gate portion G by the control unit.

As described above, the semiconductor module 1 according to the first embodiment includes the semiconductor chips 10 and the substrates 20. Each of the semiconductor chips 10 is provided with the drain portion D on one of a pair of surfaces thereof facing each other, and the source portion S and the gate portion G on the other surface. Each of the substrates 20 is capable of mounting the semiconductor chips 10, and includes the base material 21, three power supply patterns 23 provided on the base material 21 and capable of transmitting the power supplied from the power supply, and at least two signal patterns 22 provided on the base material 21 and capable of transmitting the control signal. The three power supply patterns 23 and the two signal patterns 22 extend in parallel to each other along the first direction X. Among the three power supply patterns 23, two of them are capable of mounting the semiconductor chips 10 and connectable to the drain portions D of the mounted semiconductor chips 10, and the remaining one of them is connectable to the source portions S of the semiconductor chips 10. The two signal patterns 22 are connectable to the gate portions G of the semiconductor chips 10.

With such a configuration, the semiconductor module 1 can implement a plurality of types of circuits using the same substrate 20 by changing the combination of the semiconductor chips 10 mounted on the power supply patterns 23. Furthermore, the semiconductor module 1 is composed of the three power supply patterns 23, so that it is possible to implement various types of circuits while suppressing an increase in unused power supply patterns 23 according to circuit types. That is, the semiconductor module 1 can remove the waste of the power supply patterns 23 while ensuring the versatility of a circuit. Furthermore, in the semiconductor module 1, the three power supply patterns 23 and the two signal patterns 22 extend in parallel to each other along the first direction X, so that it is possible to improve the connectivity with the semiconductor chips 10. As a consequence, in the semiconductor module 1, the substrate 20 (components) can be properly shared. Furthermore, when the semiconductor module 1 is manufactured, it is not necessary to prepare a plurality of substrates with different wiring patterns according to the type of a circuit to be implemented, so that it is possible to suppress a reduction in manufacturing efficiency. Furthermore, the semiconductor module 1 can reduce design man-hours and component management cost by sharing the substrates 20. In the semiconductor module 1, the case 40 can also be shared by sharing the substrates 20, so that the signal terminals 43 of the case 40 can be arranged correspondingly to the substrates 20. With this, in the semiconductor module 1, it is possible to share substrates of the control unit that controls the semiconductor module 1 via the signal terminals 43.

In the aforementioned semiconductor module 1, the three power supply patterns 23 are arranged such that one power supply pattern 23 connectable to the source portions S is arranged along the second direction Y orthogonal to the first direction X between the two power supply patterns 23 capable of mounting the semiconductor chips 10. Four signal patterns 22 are provided, wherein two of them are connectable to the gate portions G and the remaining two of them are connectable to the source portions S. Furthermore, in the four signal patterns 22, the two signal patterns 22 connectable to the gate portions G are arranged in a pair along the second direction Y with the three power supply patterns 23 interposed therebetween, and the two signal patterns 22 connectable to the source portions S are arranged in a pair along the second direction Y with the three power supply patterns 23 interposed therebetween. The two power supply patterns 23 capable of mounting the semiconductor chips 10 can also be used as signal patterns for the drain portions D.

With such a configuration, the semiconductor module 1 can use the second power supply pattern 232 as a power supply connection pattern for source of the first and third power supply patterns 231 and 233. Furthermore, in the semiconductor module 1, the second power supply pattern 232 is located between the first power supply pattern 231 and the third power supply pattern 233, so that it is possible to connect the first and third power supply patterns 231 and 233 and the second power supply pattern 232 without straddling the power supply patterns 23. With this, the semiconductor module 1 can relatively shorten the length of the wire Wa for connecting the first and third power supply patterns 231 and 233 and the second power supply pattern 232. In the semiconductor module 1, the four signal patterns 22 are arranged outside the three power supply patterns 23, it is possible to shorten the length of the wire Wb connected to the four signal patterns 22, as compared with a case where the four signal patterns 22 are arranged inside the three power supply patterns 23. With this, the semiconductor module 1 can reduce an inductor component of the wire Wb and make a frequency for driving the semiconductor chips 10 relatively high. Furthermore, the semiconductor module 1 can suppress the wire Wb connected to the four signal patterns 22 from being short-circuited with the three power supply patterns 23. Furthermore, the semiconductor module 1 can suppress the reduction of a routing space of the wire Wa connected to the three power supply patterns 23, by the wire Wb connected to the four signal patterns 22.

The aforementioned semiconductor module 1 further includes the external connection patterns 24 that are connectable to any one of the three power supply patterns 23, are connectable to external connection partners (power supply terminals 42 and adjacent external connection patterns 24) located outside the substrates 20, extend along the second direction Y orthogonal to the first direction X, and are provided in a pair along the first direction X with at least three power supply patterns 23 interposed therebetween. With such a configuration, the semiconductor module 1 can connect adjacent substrates 20 via, for example, the external connection patterns 24, thereby improving expandability.

The aforementioned semiconductor module 1 further includes the base part 30 on which the substrates 20 are placed and the case 40 to be assembled to the base part 30 on which the substrates 20 are placed. The case 40 includes the case body 41, the power supply terminals 42 provided on the case body 41 and connectable to the power supply patterns 23, and the signal terminals 43 provided on the case body 41 and connectable to the signal patterns 22. With such a configuration, the semiconductor module 1 can connect the substrates 20 to the power supply and the load unit via the power supply terminals 42 of the case 40, and also connect the substrates 20 to the control unit via the signal terminals 43 of the case 40, thereby improving connectivity.

In the aforementioned semiconductor module 1, among the three power supply patterns 23, one of them is a power supply connection pattern for mounting the semiconductor chips 10 thereon and is connected to the drain portions D of the mounted semiconductor chips 10, another one of them is a power supply connection pattern connected to the source portions S of the semiconductor chips 10, and the remaining one of them is a power supply non-connection pattern not connected to the drain portions D, the source portions S, and the gate portions G. Four signal patterns 22 are provided, wherein one of them is a signal connection pattern connected to the gate portions G of the semiconductor chips 10, another one of them is a signal connection pattern connected to the source portions S of the semiconductor chips 10, and the remaining two of them are signal non-connection patterns not connected to the drain portions D, the source portions S, and the gate portions G. Furthermore, the semiconductor chips 10 form the unidirectional circuit P1 that energizes or interrupts a current flowing through the power supply patterns 23 in one direction. As described above, the semiconductor module 1 can form the unidirectional circuit P1 as one of the variations according to the arrangement of the semiconductor chips 10 mounted on the substrate 20.

In the aforementioned semiconductor module 1A, among the three power supply patterns 23, two of them are each for mounting the semiconductor chips 10 thereon and are each connected to the drain portions D of the mounted semiconductor chips 10, and the remaining one of them is connected to the source portions S of the semiconductor chips 10. Four signal patterns 22 are provided, wherein two of them are connected to the gate portion G of any of the semiconductor chips 10, and the remaining two of them are connected to the source portion S of any of the semiconductor chips 10. Furthermore, the semiconductor chips 10 form the bidirectional circuit P2 that energizes or interrupts a current flowing through the power supply patterns 23 in both directions. As described above, the semiconductor module 1A can form the bidirectional circuit P2 as one of the variations according to the arrangement of the semiconductor chips 10 mounted on the substrates 20.

The aforementioned semiconductor module 1B further includes the external connection patterns 24 that are connectable to any one of the three power supply patterns 23, are connectable to the external connection patterns 24 located outside the substrates 20, extend along the second direction Y orthogonal to the first direction X, and are provided in a pair along the first direction X with at least the three power supply patterns 23 interposed therebetween. Three substrates 20 each having the semiconductor chips 10 mounted thereon are provided and are arranged side by side along the second direction Y orthogonal to the first direction X. Adjacent substrates 20 are connected to each other via the external connection patterns 24. In each of the substrates 20, among the three power supply patterns 23, two of them are each for mounting the semiconductor chips 10 thereon and are each connected to the drain portions D of the mounted semiconductor chips 10, and the remaining one of them is connected to the source portions S of the semiconductor chips 10 mounted on one of them, one of the two power supply patterns 23 connected to the drain portions D is connected to the source portions S of the semiconductor chips 10 mounted on the other of the two power supply patterns 23. Four signal patterns 22 are provided, wherein two of them are connected to the gate portion G of any of the semiconductor chips 10, and the remaining two of them are connected to the source portion S of any of the semiconductor chips 10. Furthermore, the semiconductor chips 10 form the inverter circuit P3 that converts DC power into AC power. As described above, the semiconductor module 1B can form the inverter circuit P3 as one of variations according to the arrangement of the semiconductor chips 10 mounted on the substrates 20.

Modification of First Embodiment

Next, a modification of the embodiment will be described. Note that, in the modification, the same components as those in the embodiment are denoted by the same reference numerals, and detailed description thereof will be omitted. FIG. 10 is a plan view illustrating a configuration example of a semiconductor module 1C according to the modification of the first embodiment. FIG. 11 is a circuit diagram illustrating the configuration example of the semiconductor module 1C according to the modification of the first embodiment. The semiconductor module 1C is different from the semiconductor module 1 of the first embodiment in that external connection patterns 24A are not provided on substrates 20A but are provided on a case 40A.

The semiconductor module 1C includes the semiconductor chips 10, the substrates 20A, the base part 30, and the case 40A.

The substrate 20A includes the base materials 21, the signal patterns 22 (221 to 224), and the power supply patterns 23 (231 to 233), and does not include the external connection patterns 24A.

The case 40A includes the case body 41, the power supply terminals 42 (421 and 422), the signal terminals 43 (D11, S11, G11, D12, S12, G12, and the like), and the external connection patterns 24A. Two external connection patterns 24A are provided on the case body 41 in each substrate 20A and are formed in a linear shape. The two external connection patterns 24A (241A and 242A) are formed in a straight-line shape and extend in parallel to each other along the second direction Y. The two external connection patterns 241A and 242A are all formed to have the same thickness, that is, width lengths in the first direction X are formed to be the same. The two external connection patterns 241A and 242A are all formed to have the same length in the second direction Y, and are provided in a pair along the first direction X with at least three power supply patterns 23 (231 to 233) interposed therebetween. Typically, the two external connection patterns 241A and 242A are provided in a pair along the first direction X with the three power supply patterns 23 (231 to 233) and the four signal patterns 22 (221 to 224) interposed therebetween. In the two external connection patterns 241A and 242A, the positions of respective ends thereof on the one side in the second direction Y are aligned and the positions of respective ends thereof on the other side in the second direction Y are also aligned. The two external connection patterns 241A and 242A are connectable to any one of the three power supply patterns 23 and are connectable to external connection partners (power supply terminals 42 (421 and 422) and the other external connection patterns 24A) located outside the substrate 20A. As described above, the semiconductor module 1C may have a configuration in which the two external connection patterns 241A and 242A are provided on the case 40A in each substrate 20A. FIG. 10 and FIG. 11 illustrate an example in which the semiconductor module 1C forms the unidirectional circuit P1 described above.

Second Embodiment

Figure 12:
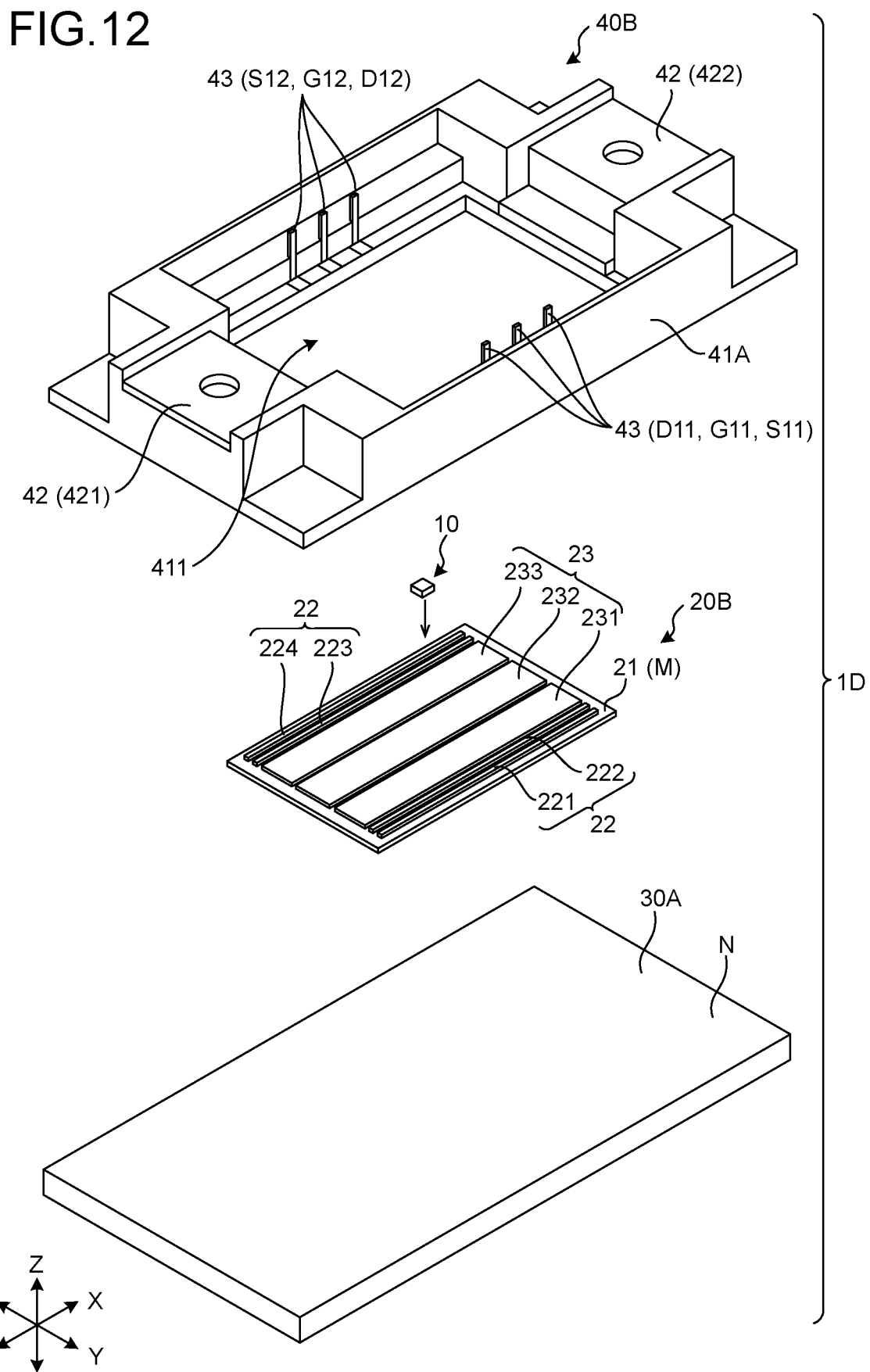
FIG. 12 is an exploded perspective view illustrating a basic configuration example of a semiconductor module according to a second embodiment.

Next, a semiconductor module 1D according to the second embodiment will be described. FIG. 12 is an exploded perspective view illustrating a basic configuration example of the semiconductor module 1D according to the second embodiment. The semiconductor module 1D is different from the semiconductor module 1 according to the first embodiment in that it has one substrate 20B.

As illustrated in FIG. 12, the basic configuration of the semiconductor module 1D includes the semiconductor chip 10, the substrate 20B, a base part 30A, and a case 40B. Furthermore, the semiconductor module 1D constitutes various semiconductor circuits according to the configuration of the semiconductor chip 10 by mounting the semiconductor chip 10 on the basic configuration.

The substrate 20B includes the base material 21, the signal patterns 22, and the power supply patterns 23, and does not include the external connection patterns 24.

The base part 30A is for placing one substrate 20B thereon. The base part 30A is made of a metal member having thermal conductivity and is formed in a flat plate shape and a rectangular shape. The base part 30A has a pair of surface portions in the third direction Z, and a substrate mounting surface N on which one substrate 20B and the case 40B are mounted is provided on one surface portion thereof.

The case 40B is a housing that accommodates the substrate 20B on which the semiconductor chip 10 is mounted. The case 40B includes a case body 41A, the power supply terminals 42, and the signal terminals 43, and does not include the relay terminals 44.

The case body 41A is made of an insulating member such as resin and has one accommodating part 411. The one accommodating part 411 is formed in a rectangular shape according to the outer shape of the substrate 20B.

The power supply terminals 42 are provided on the case body 41A and include the first terminal 421 and the second terminal 422. The first terminal 421 is provided on one side of the one accommodating part 411 in the first direction X. The second terminal 422 is provided on the other side of the one accommodating part 411 in the first direction X.

The signal terminals 43 are provided on the case body 41A and include the signal patterns S11 and S12 for source, the signal patterns D11 and D12 for drain, and the signal patterns G11 and G12 for gate. The signal pattern S11 for source, the signal pattern D11 for drain, and the signal pattern G11 for gate are provided on one side of the one accommodating part 411 in the second direction Y. Furthermore, the signal pattern S12 for source, the signal pattern D12 for drain, and the signal pattern G12 for gate are provided on the other side of the one accommodating part 411 in the second direction Y.

The semiconductor module 1D does not include the external connection patterns 24 and the relay terminals 44, so that the configuration of the semiconductor module 1D can be simplified as compared with that of the semiconductor module 1.

First Variation of Second Embodiment

Figure 13:
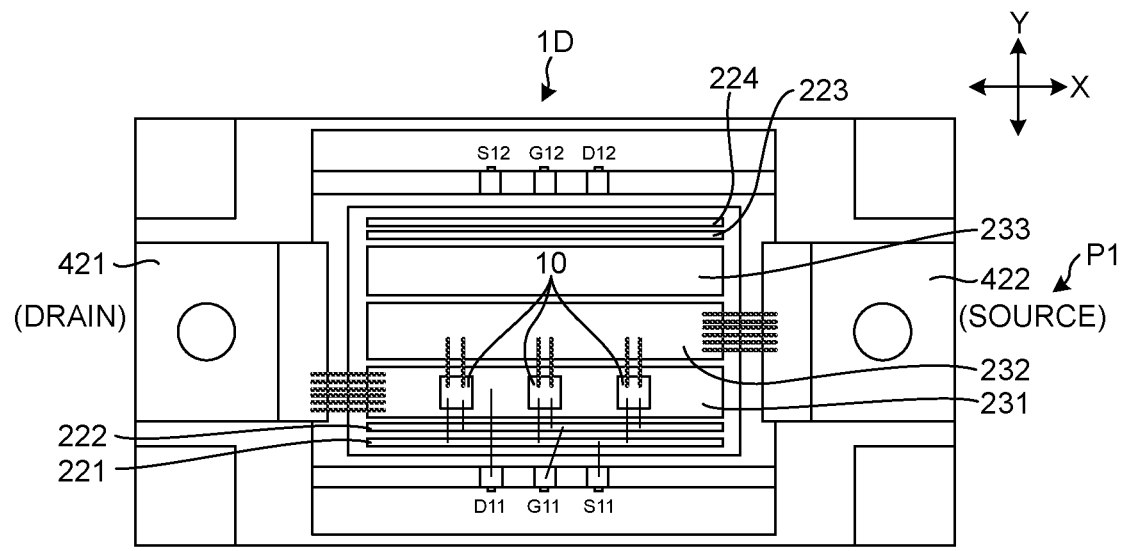
FIG. 13 is a plan view illustrating a configuration example (first variation) of the semiconductor module according to the second embodiment.
Figure 14:
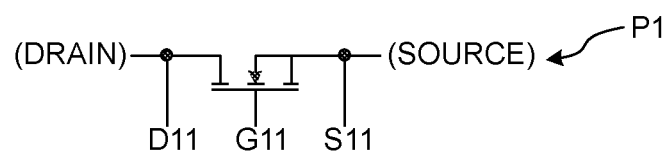
FIG. 14 is a circuit diagram illustrating the configuration example (first variation) of the semiconductor module according to the second embodiment.

Next, an example in which the semiconductor chips 10 are mounted on the substrate 20B described in the aforementioned basic configuration and are accommodated in the case 40B will be described. FIG. 13 is a plan view illustrating a configuration example (first variation) of the semiconductor module 1D according to the second embodiment. FIG. 14 is a circuit diagram illustrating the configuration example (first variation) of the semiconductor module 1D according to the second embodiment. Note that in the circuit diagram of FIG. 14, the configuration example of the semiconductor module 1D illustrated in FIG. 13 is simplified and illustrated.

The semiconductor module 1D illustrated in FIG. 13 is provided, for example, in the power supply system of the vehicle, and energizes or interrupts a current flowing in a single direction (one direction) from the power supply of the vehicle to the load unit. The semiconductor module 1D can be arranged at various locations in the power supply system of the vehicle. For example, when the semiconductor module 1D is arranged between the positive side of the power supply and the load unit, the first terminal 421 of the power supply terminals 42 is connected to the positive side of the power supply of the vehicle, and the second terminal 422 of the power supply terminals 42 is connected to the load unit. Furthermore, when the semiconductor module 1D is arranged between the negative side of the power supply and the load unit, the first terminal 421 of the power supply terminals 42 is connected to the load unit, and the second terminal 422 of the power supply terminals 42 is connected to the negative side of the power supply of the vehicle. Furthermore, in the semiconductor module 1D, the first terminal 421 of the power supply terminals 42 is connected to the first power supply pattern 231 via the wire Wa, and the second terminal 422 of the power supply terminals 42 is connected to the second power supply pattern 232 via the wire Wa. Since the connection relation between the three semiconductor chips 10 or the signal patterns 22 is the same as that of the semiconductor module 1 illustrated in FIG. 4, description thereof will be omitted. As described above, the semiconductor module 1D may form one unidirectional circuit P1.

Second Variation of Second Embodiment

Figure 15:
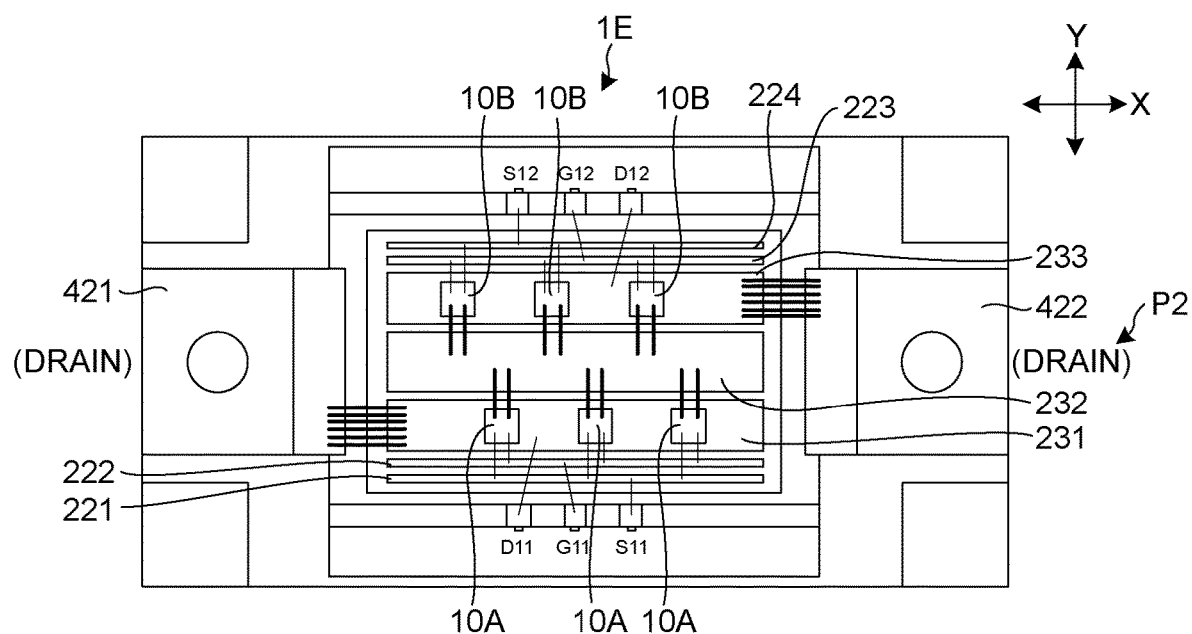
FIG. 15 is a plan view illustrating a configuration example (second variation) of a semiconductor module according to the second embodiment.
Figure 16:
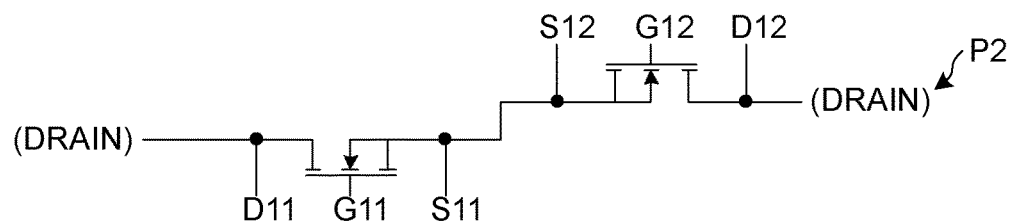
FIG. 16 is a circuit diagram illustrating the configuration example (second variation) of the semiconductor module according to the second embodiment.

Next, a semiconductor module 1E according to a second variation of the second embodiment will be described. The semiconductor module 1E is different from the semiconductor module 1D according to the first variation of the second embodiment in that it forms a bidirectional circuit P2. FIG. 15 is a plan view illustrating a configuration example (second variation) of the semiconductor module 1E according to the second embodiment. FIG. 16 is a circuit diagram illustrating the configuration example (second variation) of the semiconductor module 1E according to the second embodiment. Note that in the circuit diagram of FIG. 16, the configuration example of the semiconductor module 1E illustrated in FIG. 15 is simplified and illustrated.

The semiconductor module 1E illustrated in FIG. 15 is provided, for example, in the power supply system of the vehicle, and energizes or interrupts a current flowing in both directions from the power supply of the vehicle to the load unit. In the semiconductor module 1E, for example, the first terminal 421 of the power supply terminal 42 is connected to the power supply of the vehicle and the second terminal 422 of the power supply terminal 42 is connected to the load unit. Since the semiconductor module 1E is a bidirectional circuit, the first terminal 421 of the power supply terminal 42 may be connected to the load unit and the second terminal 422 of the power supply terminal 42 may be connected to the power supply of the vehicle. Furthermore, in the semiconductor module 1E, the first terminal 421 of the power supply terminal 42 is connected to the first power supply pattern 231 via the wire Wa, and the second terminal 422 of the power supply terminal 42 is connected to the third power supply pattern 233 via the wire Wa. Since the connection relation between the six semiconductor chips 10 or the signal patterns 22 is the same as that of the semiconductor module 1A illustrated in FIG. 6, description thereof will be omitted. As described above, the semiconductor module 1E may form one bidirectional circuit P2.

The above description has described an example in which among the three power supply patterns 23, two of them capable of mounting the semiconductor chips 10 thereon are arranged on both sides along the second direction Y, respectively, and one of them connectable to the source portions S is arranged in the center along the second direction Y; however, the present invention is not limited thereto. For example, among the three power supply patterns 23, two of them capable of mounting the semiconductor chips 10 thereon may be arranged on one side along the second direction Y, and one of them connectable to the source portions S may be arranged on the other side along the second direction Y.

The above description has described an example in which four signal patterns 22 are provided; however, the present invention is not limited thereto and it is sufficient if at least two signal patterns 22 are provided. When two signal patterns 22 are provided, each of the two signal patterns 22 is connectable to the gate portions G.

The above description has described an example in which among the four signal patterns 22, two of them and the remaining two of them are arranged in pairs along the second direction Y with the three power supply patterns 23 interposed therebetween; however, the present invention is not limited thereto. For example, the four signal patterns 22 may be provided among the three power supply patterns 23 along the second direction Y.

The above description has described an example in which among the four signal patterns 22 (221 to 224), the two signal patterns 222 and 223 located on the inside (the three power supply patterns 23 side) in the second direction Y are connectable to the gate portions G of the semiconductor chips 10, and the two signal patterns 221 and 224 located on the outside (opposite side of the three power supply patterns 23) in the second direction Y are connectable to the source portions S of the semiconductor chips 10; however, the present invention is not limited thereto. For example, among the four signal patterns 22 (221 to 224), the two signal patterns 222 and 223 located on the inside (the three power supply patterns 23 side) in the second direction Y may be connectable to the source portions S of the semiconductor chips 10, and the two signal patterns 221 and 224 located on the outside (opposite side of the three power supply patterns 23) in the second direction Y may be connectable to the gate portions G of the semiconductor chips 10.

The above description has described an example in which the semiconductor chip 10 is an N-channel MOSFET; however, the present invention is not limited thereto. For example, the semiconductor chip 10 may be a P-channel MOSFET.

The above description has described an example in which the four signal patterns 22 are all formed to have the same length and the same thickness in the first direction X; however, the present invention is not limited thereto and the four signal patterns 22 may have different lengths and thicknesses.

The above description has described an example in which the three power supply patterns 23 are all formed to have the same length and the same thickness in the first direction X; however, the present invention is not limited thereto and the three power supply patterns 23 may have different lengths and thicknesses.

The above description has described an example in which the four signal patterns 22 are formed to have the same lengths as those of the three power supply patterns 23; however, the present invention is not limited thereto and the four signal patterns 22 may have lengths different from those of the three power supply patterns 23. For example, the four signal patterns 22 may be shorter than the three power supply patterns 23 or longer than the three power supply patterns 23.

The above description has described an example in which the base part 30 is formed in a flat plate shape and a rectangular shape; however, the present invention is not limited thereto. For example, the base part 30 may be provided with heat dissipation fins to improve heat dissipation.

REFERENCE EXAMPLE

The above description has described an example in which the three power supply patterns 23 are formed in a linear shape; however, as a reference example, the three power supply patterns 23 may be formed in an L-shape.

In the semiconductor module according to the present embodiment, the three power supply patterns are arranged such that two of them are capable of mounting the semiconductor chips and are connectable to the drain portions of the mounted semiconductor chip and the remaining one of them is connectable to the source portions of the mounted semiconductor chips, thereby achieving the proper sharing of components (substrate).

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor module comprising:
   semiconductor chips each provided with a drain portion on one of a pair of surfaces facing each other, and a source portion and a gate portion on the other surface; and
   substrates each including a base material, three power supply patterns provided on the base material and capable of transmitting power supplied from a power supply, and at least two signal patterns provided on the base material and capable of transmitting a control signal, the substrate being capable of mounting the semiconductor chips thereon, wherein
   the three power supply patterns and the two signal patterns extend in parallel to each other along a first direction,
   among the three power supply patterns, two of the three power supply patterns are capable of mounting the semiconductor chips thereon and connectable to the drain portions of the mounted semiconductor chips, and remaining one of the three power supply pattern is connectable to the source portions of the mounted semiconductor chips, and
   the two signal patterns are connectable to the gate portions of the mounted semiconductor chips.

2. The semiconductor module according to claim 1, wherein,
   in the three power supply patterns, the one power supply pattern connectable to the source portions is arranged along the second direction orthogonal to the first direction between the two power supply patterns capable of mounting the semiconductor chips,
   four signal patterns are provided, and two of the signal patterns are connectable to the gate portions, remaining two of the signal patterns are connectable to the source portions, the two signal patterns connectable to the gate portions are arranged in a pair along the second direction with the three power supply patterns interposed therebetween, and the two signal patterns connectable to the source portions are arranged in a pair along the second direction with the three power supply patterns interposed therebetween, and
   the two power supply patterns capable of mounting the semiconductor chips thereon are usable as signal patterns for the drain portions.

3. The semiconductor module according to claim 2, further comprising:
   external connection patterns that are connectable to any one of the three power supply patterns, are connectable to an external connection partner located outside the substrates, extend along the second direction orthogonal to the first direction, and are provided in a pair along the first direction with at least the three power supply patterns interposed therebetween.

4. The semiconductor module according to claim 2, further comprising:
   a base part on which the substrates are placed; and a case assembled to the base part on which the substrates are placed, wherein the case includes a case body, power supply terminals provided on the case body and connectable to the power supply patterns, and signal terminals provided on the case body and connectable to the signal patterns.

5. The semiconductor module according to claim 2, wherein, among the three power supply patterns, one of the three power supply patterns is a power supply connection pattern for mounting the semiconductor chips thereon and is connected to the drain portions of the mounted semiconductor chips, another one of the three power supply patterns is a power supply connection pattern connected to the source portions of the mounted semiconductor chips, and remaining one of the three power supply patterns is a power supply non-connection pattern not connected to the drain portions, the source portions, and the gate portions of the mounted semiconductor chips, four signal patterns are provided, and one of the four signal patterns is a signal connection pattern connected to the gate portions of the mounted semiconductor chips, another one of the four signal patterns is a signal connection pattern connected to the source portions of the mounted semiconductor chips, and remaining two of the four signal patterns are signal non-connection patterns not connected to the drain portions, the source portions, and the gate portions of the mounted semiconductor chips, and the mounted semiconductor chips form a unidirectional circuit that energizes or interrupts a current flowing through the power supply patterns in one direction.

6. The semiconductor module according to claim 2, wherein, among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips, and four signal patterns are provided, and two of the four signal patterns are connected to the gate portion of any of the mounted semiconductor chips, and remaining two of the four signal patterns are connected to the source portion of any of the mounted semiconductor chips, and the mounted semiconductor chips form a bidirectional circuit that energizes or interrupts a current flowing through the power supply patterns in both directions.

7. The semiconductor module according to claim 2, further comprising:

external connection patterns that are connectable to any one of the three power supply patterns, are connectable to an external connection partner located outside the substrates, extend along the second direction orthogonal to the first direction, and are provided in a pair along the first direction with at least the three power supply patterns interposed therebetween, wherein three substrates, on which the semiconductor chips are mounted, are provided and are arranged side by side along the second direction, the adjacent substrates are connected to each other via the external connection patterns, in each of the substrates, among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips mounted on one of the three power supply patterns, one of the two power supply patterns connected to the drain portions is connected to the source portions of the mounted semiconductor chips mounted on the other of the two power supply patterns, and four signal patterns are provided, and two of the four signal patterns are connected to the gate portion of any of the mounted semiconductor chips, and remaining two of the four signal patterns are connected to the source portion of any of the mounted semiconductor chips, and the mounted semiconductor chips form an inverter circuit that converts DC power into AC power.

8. The semiconductor module according to claim 1, further comprising:

external connection patterns that are connectable to any one of the three power supply patterns, are connectable to an external connection partner located outside the substrates, extend along the second direction orthogonal to the first direction, and are provided in a pair along the first direction with at least the three power supply patterns interposed therebetween.

9. The semiconductor module according to claim 8, further comprising:

a base part on which the substrates are placed; and a case assembled to the base part on which the substrates are placed, wherein the case includes a case body, power supply terminals provided on the case body and connectable to the power supply patterns, and signal terminals provided on the case body and connectable to the signal patterns.

10. The semiconductor module according to claim 8, wherein, among the three power supply patterns, one of the three power supply patterns is a power supply connection pattern for mounting the semiconductor chips thereon and is connected to the drain portions of the mounted semiconductor chips, another one of the three power supply patterns is a power supply connection pattern connected to the source portions of the mounted semiconductor chips, and remaining one of the three power supply patterns is a power supply non-connection pattern not connected to the drain portions, the source portions, and the gate portions of the mounted semiconductor chips, four signal patterns are provided, and one of the four signal patterns is a signal connection pattern connected to the gate portions of the mounted semiconductor chips, another one of the four signal patterns is a signal connection pattern connected to the source portions of the mounted semiconductor chips, and remaining two of the four signal patterns are signal non-connection patterns not connected to the drain portions, the source portions, and the gate portions of the mounted semiconductor chips, and the mounted semiconductor chips form a unidirectional circuit that energizes or interrupts a current flowing through the power supply patterns in one direction.

11. The semiconductor module according to claim 8, wherein, among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips, and four signal patterns are provided, and two of the four signal patterns are connected to the gate portion of any of the mounted semiconductor chips, and remaining two of the four signal patterns are connected to the source portion of any of the mounted semiconductor chips, and the mounted semiconductor chips form a bidirectional circuit that energizes or interrupts a current flowing through the power supply patterns in both directions.

12. The semiconductor module according to claim 8, further comprising:

external connection patterns that are connectable to any one of the three power supply patterns, are connectable to an external connection partner located outside the substrates, extend along the second direction orthogonal to the first direction, and are provided in a pair along the first direction with at least the three power supply patterns interposed therebetween, wherein three substrates, on which the semiconductor chips are mounted, are provided and are arranged side by side along the second direction, the adjacent substrates are connected to each other via the external connection patterns, in each of the substrates, among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips mounted on one of the three power supply patterns, one of the two power supply patterns connected to the drain portions is connected to the source portions of the mounted semiconductor chips mounted on the other of the two power supply patterns, and four signal patterns are provided, and two of the four signal patterns are connected to the gate portion of any of the mounted semiconductor chips, and remaining two of the four signal patterns are connected to the source portion of any of the mounted semiconductor chips, and the mounted semiconductor chips form an inverter circuit that converts DC power into AC power.

13. The semiconductor module according to claim 1, further comprising:

a base part on which the substrates are placed; and
a case assembled to the base part on which the substrates are placed, wherein the case includes a case body, power supply terminals provided on the case body and connectable to the power supply patterns, and signal terminals provided on the case body and connectable to the signal patterns.

14. The semiconductor module according to claim 13, wherein, among the three power supply patterns, one of the three power supply patterns is a power supply connection pattern for mounting the semiconductor chips thereon and is connected to the drain portions of the mounted semiconductor chips, another one of the three power supply patterns is a power supply connection pattern connected to the source portions of the mounted semiconductor chips, and remaining one of the three power supply patterns is a power supply non-connection pattern not connected to the drain portions, the source portions, and the gate portions of the mounted semiconductor chips, four signal patterns are provided, and one of the four signal patterns is a signal connection pattern connected to the gate portions of the mounted semiconductor chips, another one of the four signal patterns is a signal connection pattern connected to the source portions of the mounted semiconductor chips, and remaining two of the four signal patterns are signal non-connection patterns not connected to the drain portions, the source portions, and the gate portions of the mounted semiconductor chips, and the mounted semiconductor chips form a unidirectional circuit that energizes or interrupts a current flowing through the power supply patterns in one direction.

15. The semiconductor module according to claim 13, wherein, among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips, and four signal patterns are provided, and two of the four signal patterns are connected to the gate portion of any of the mounted semiconductor chips, and remaining two of the four signal patterns are connected to the source portion of any of the mounted semiconductor chips, and the mounted semiconductor chips form a bidirectional circuit that energizes or interrupts a current flowing through the power supply patterns in both directions.

16. The semiconductor module according to claim 13, further comprising:

external connection patterns that are connectable to any one of the three power supply patterns, are connectable to an external connection partner located outside the substrates, extend along the second direction orthogonal to the first direction, and are provided in a pair along the first direction with at least the three power supply patterns interposed therebetween, wherein three substrates, on which the semiconductor chips are mounted, are provided and are arranged side by side along the second direction, the adjacent substrates are connected to each other via the external connection patterns, in each of the substrates, among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips mounted on one of the three power supply patterns, one of the two power supply patterns connected to the drain portions is connected to the source portions of the mounted semiconductor chips mounted on the other of the two power supply patterns, and four signal patterns are provided, and two of the four signal patterns are connected to the gate portion of any of the mounted semiconductor chips, and remaining two of the four signal patterns are connected to the source portion of any of the mounted semiconductor chips, and the mounted semiconductor chips form an inverter circuit that converts DC power into AC power.

17. The semiconductor module according to claim 1, wherein,
among the three power supply patterns, one of the three power supply patterns is a power supply connection pattern for mounting the semiconductor chips thereon and is connected to the drain portions of the mounted semiconductor chips, another one of the three power supply patterns is a power supply connection pattern connected to the source portions of the mounted semiconductor chips, and remaining one of the three power supply patterns is a power supply non-connection pattern not connected to the drain portions, the source portions, and the gate portions of the mounted semiconductor chips,
four signal patterns are provided, and one of the four signal patterns is a signal connection pattern connected to the gate portions of the mounted semiconductor chips, another one of the four signal patterns is a signal connection pattern connected to the source portions of the mounted semiconductor chips, and remaining two of the four signal patterns are signal non-connection patterns not connected to the drain portions, the source portions, and the gate portions of the mounted semiconductor chips, and
the mounted semiconductor chips form a unidirectional circuit that energizes or interrupts a current flowing through the power supply patterns in one direction.

18. The semiconductor module according to claim 1, wherein,
among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips, and
four signal patterns are provided, and two of the four signal patterns are connected to the gate portion of any of the mounted semiconductor chips, and remaining two of the four signal patterns are connected to the source portion of any of the mounted semiconductor chips, and
the mounted semiconductor chips form a bidirectional circuit that energizes or interrupts a current flowing through the power supply patterns in both directions.

19. The semiconductor module according to claim 1, further comprising:
external connection patterns that are connectable to any one of the three power supply patterns, are connectable to an external connection partner located outside the substrates, extend along the second direction orthogonal to the first direction, and are provided in a pair along the first direction with at least the three power supply patterns interposed therebetween, wherein
three substrates, on which the semiconductor chips are mounted, are provided and are arranged side by side along the second direction,
the adjacent substrates are connected to each other via the external connection patterns,
in each of the substrates, among the three power supply patterns, two of the three power supply patterns are each for mounting the semiconductor chips thereon and are each connected to the drain portions of the mounted semiconductor chips, and remaining one of the three power supply patterns is connected to the source portions of the mounted semiconductor chips mounted on one of the three power supply patterns, one of the two power supply patterns connected to the drain portions is connected to the source portions of the mounted semiconductor chips mounted on the other of the two power supply patterns, and
four signal patterns are provided, and two of the four signal patterns are connected to the gate portion of any of the mounted semiconductor chips, and remaining two of the four signal patterns are connected to the source portion of any of the mounted semiconductor chips, and
the mounted semiconductor chips form an inverter circuit that converts DC power into AC power.

* * * * *